United States Patent
Dodoc et al.

(10) Patent No.: US 8,212,991 B2
(45) Date of Patent: Jul. 3, 2012

(54) OPTICAL SYSTEM OF A MICROLITHOGRAPHIC PROJECTION EXPOSURE APPARATUS

(75) Inventors: Aurelian Dodoc, Heidenheim (DE); Albrecht Ehrmann, Koenigsbronn (DE); Sascha Bleidistel, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 398 days.

(21) Appl. No.: 12/628,294

(22) Filed: Dec. 1, 2009

(65) Prior Publication Data

US 2010/0073655 A1 Mar. 25, 2010

Related U.S. Application Data

(63) Continuation of application No. 12/188,652, filed on Aug. 8, 2008, now abandoned, which is a continuation of application No. 11/911,899, filed as application No. PCT/EP2006/004520 on May 13, 2006, now abandoned.

(60) Provisional application No. 60/683,562, filed on May 23, 2005.

(30) Foreign Application Priority Data

May 23, 2005 (DE) .......................... 10 2005 024 163

(51) Int. Cl.
G03B 27/42 (2006.01)
G03B 27/68 (2006.01)
G03B 27/58 (2006.01)

(52) U.S. Cl. ................................. 355/53; 355/52; 355/72

(58) Field of Classification Search .................... 355/52, 355/53, 55, 30, 72

See application file for complete search history.

(56) References Cited

U.S. PATENT DOCUMENTS

| 5,610,683 | A | 3/1997 | Takahashi |
| 7,324,185 | B2 | 1/2008 | Mulkens et al. |
| 7,405,805 | B2 | 7/2008 | Uitterdijk et al. |
| 7,460,206 | B2 | 12/2008 | Weissenrieder et al. |
| 2005/0068499 | A1 | 3/2005 | Dodoc et al. |
| 2005/0094119 | A1 | 5/2005 | Loopstra et al. |
| 2005/0259234 | A1 | 11/2005 | Hirukawa et al. |
| 2006/0066962 | A1 | 3/2006 | Totzeck et al. |
| 2006/0098297 | A1 | 5/2006 | Van Peski et al. |
| 2006/0119820 | A1 | 6/2006 | Hirukawa |

(Continued)

FOREIGN PATENT DOCUMENTS

DE 221 563 4/1985

(Continued)

OTHER PUBLICATIONS

Shafer et al. v. Omura, "Shafer Motions List," for Patent Interference No. 105,678 (SCM), filed Mar. 25, 2009 with the United States Patent and Trademark Office before the Board of Patent Appeals and Interferences (13 pages).

(Continued)

Primary Examiner — Peter B Kim
(74) Attorney, Agent, or Firm — Fish & Richardson P.C.

(57) ABSTRACT

An optical system of a microlithographic projection exposure apparatus contains a module, which can be fitted in the optical system and removed from it as a unit. The module contains a cavity which can be completely filled with a liquid and hermetically sealed, and a concavely curved optical surface which bounds the cavity at the top during operation of the projection exposure apparatus. This makes it possible to fill the module outside the optical system. The module can be tilted there so that no air bubble, which prevents complete filling, can form below the concavely curved optical surface.

33 Claims, 17 Drawing Sheets

U.S. PATENT DOCUMENTS

| | | |
|---|---|---|
| 2006/0187430 A1 | 8/2006 | Dodoc et al. |
| 2006/0261288 A1 | 11/2006 | Van Santen |
| 2007/0030467 A1 | 2/2007 | Horikawa |
| 2007/0070323 A1 | 3/2007 | Nagasaka |
| 2007/0165198 A1 | 7/2007 | Kneer et al. |
| 2008/0106711 A1 | 5/2008 | Beierl et al. |
| 2008/0304032 A1 | 12/2008 | Schuster |
| 2008/0304033 A1 | 12/2008 | Kneer et al. |
| 2008/0316452 A1 | 12/2008 | Dodoc et al. |

FOREIGN PATENT DOCUMENTS

| | | |
|---|---|---|
| DE | 103 24 477 | 12/2004 |
| EP | 1 571 697 | 9/2005 |
| EP | 1 571 701 | 9/2005 |
| WO | WO 2004/053950 | 6/2004 |
| WO | WO 2004/053955 | 6/2004 |
| WO | WO 2004/055803 | 7/2004 |
| WO | WO 2004/090956 | 10/2004 |
| WO | WO 2005/059654 | 6/2005 |
| WO | WO 2005/081067 | 9/2005 |
| WO | WO 2005/106589 | 11/2005 |

OTHER PUBLICATIONS

Shafer et al. v. Omura, "Judgment—Request for Adverse—Bd.R. 127(b)," for Patent Interference No. 105,678 (SCM), filed Aug. 31, 2009 with the United States Patent and Trademark Office before the Board of Patent Appeals and Interferences (3 pages).

OPTICAL SYSTEM OF A MICROLITHOGRAPHIC PROJECTION EXPOSURE APPARATUS

CROSS-REFERENCE TO RELATED APPLICATIONS

This application is a continuation of U.S. application Ser. No. 12/188,652, filed Aug. 8, 2008, which is a continuation of U.S. application Ser. No. 11/911,899, filed Mar. 25, 2008, now abandoned, which is a National Phase application under 35 U.S.C. §371 filed from International Patent Application Serial No. PCT/EP2006/004520, filed on May 13, 2006, which claims priority to U.S. Provisional Application Ser. No. 60/683,562, filed May 23, 2005. International Patent Application Serial No. PCT/EP2006/004520 also claims priority to German Patent Application Serial No. 10 2005 024 163.8, filed on May 23, 2005.

BACKGROUND OF THE INVENTION

1. Field of the Invention

The invention relates to optical systems of microlithographic projection exposure apparatus, such as those used for the production of large-scale integrated electrical circuits and other microstructured components. The invention relates in particular to a projection objective of such a system which contains an optical surface, curved concavely upward, which is next to a liquid.

2. Description of the Prior Art

Integrated electrical circuits and other microstructured components are conventionally produced by applying a plurality of structured layers on a suitable substrate which, for example, may be a silicon wafer. In order to structure the layers, they are first covered with a photoresist which is sensitive to light of a particular wavelength range, for example light in the deep ultraviolet (DUV) spectral range. The wafer coated in this way is subsequently exposed in a projection exposure apparatus. During the exposure a pattern of diffracting structures contained in a mask is imaged onto the photoresist with the aid of a projection objective. Since the imaging scale is generally less than 1, such projection objectives are often also referred to as reduction objectives.

After the photoresist has been developed, the wafer is subjected to an etching process so that the layer becomes structured according to the pattern on the mask. The remaining photoresist is then removed from the other parts of the layer. This process is repeated until all the layers have been applied on the wafer.

One of the essential aims in the development of the projection exposure apparatus used for production is to be able to lithographically define structures with smaller and smaller dimensions on the wafer. Small structures lead to high integration densities, and this generally has a favourable effect on the performance of the microstructured components produced with the aid of such apparatus.

The size of the structures which can be defined depends primarily on the resolution of the projection objective being used. Since the resolution of the projection objectives is inversely proportional to the wavelength of the projection light, one way of increasing the resolution is to use projection light with shorter and shorter wavelengths. The shortest wavelengths used at present are in the deep ultraviolet (DUV) spectral range, namely 193 nm or sometimes even 157 nm.

Another way of reducing the resolution is based on the idea of introducing an immersion liquid with a high refractive index into an intermediate space which remains between a last lens on the image side of the projection objective and the photoresist, or another photosensitive layer to be exposed. Projection objectives which are designed for immersed operation, and which are therefore also referred to as immersion objectives, can achieve numerical apertures of more than 1, for example 1.3 or 1.4.

Immersion not only allows high numerical apertures and therefore better resolution, moreover, but also has a favourable effect on the depth of focus. The greater the depth of focus is, the lower are the requirements for exact positioning of the wafer in the image plane of the projection objective.

PCT/EP2004/014727 has proposed that a lens whose image-side surface, which is next to the immersion liquid, is concavely curved may be used as the last optical element on the image side. In this way, the angles of incidence occurring for light at the interface between the last optical element on the image side and the immersion liquid are kept small, so that total reflection can be avoided.

Similar lenses are disclosed in WO 2005/106589 A1, WO 2005/059654 A1, US 2006/0066962 A1 and the US provisional applications from which this US application claims benefit.

Since the projection objective has to date always been arranged above the photosensitive layer so that the mask is projected onto the layer from above, this leads to a cavity being formed below the concavely curved surface, which needs to be filled with the immersion liquid before the projection, exposure apparatus is put into operation. Complete filling of this cavity, however, entails difficulties since the inflowing liquid traps a bubble of air below the concave surface, which cannot escape upwards. In this context, the term "air" is also intended to include any other gas (mixture) and, in particular, a protective gas surrounding the projection objective. Such an air bubble would impair the imaging properties of the projection objective to an intolerable extent. Of course, it would in principle be possible simply to turn the projection objective upside down for the purpose of filling with the immersion liquid, then seal the cavity and return the projection objective into the normal operating position. Such tilting of the projection objective, however, is prohibited by the extremely high requirement for the adjustment accuracy which is conventionally demanded of projection objectives.

It is known from WO 2004/090956 to reverse the hitherto very conventional arrangement of projection exposure apparatus, in which the projection objective is situated above the photosensitive layer. The mask is therefore projected onto the photosensitive layer not from above but from below. A concavely curved surface on the image side then likewise protrudes downward, so that no air can be trapped below the concavely curved surface when the cavity is being filled. The arrangement of the projection exposure apparatus as described there, however, is disadvantageous for other reasons and furthermore requires very substantial reconstruction of virtually all the system components involved.

Furthermore, the problem of how cavities below upwardly protruding optical surfaces can be filled with a liquid is not only encountered in connection with immersion objectives. It has variously also been proposed to place plane or curved surfaces of lenses or mirrors next to a liquid inside a projection objective or an illumination system. In the case of lenses, for example, chromatic aberrations can be corrected well in this way. If the surface bounding the cavity at the top is concavely curved, then in principle the same problems as those explained above in connection with immersion objectives will be encountered when filling the cavity with a liquid.

SUMMARY OF THE INVENTION

It is therefore an object of the invention to improve an optical system, i.e. a projection objective or an illumination system, of a microlithographic projection exposure apparatus so as to make is easier for a cavity, which is bounded at the top by a concavely curved optical surface during operation, to be filled with a liquid.

According to a first aspect of the invention, this object is achieved by an optical system having a module, which can be fitted in the optical system and removed from it as a unit. The module contains a cavity which can be completely filled with a liquid and hermetically sealed, and a concavely curved optical surface which bounds the cavity at the top during operation of the projection exposure apparatus.

Such a modular structure makes it possible to fill the module outside the optical system. There, the module can be tilted so that no air bubbles that prevent complete filling can form below the concavely curved optical surface, which may be refractive or reflective.

Such a module is suitable above for filling cavities such as those which lie inside the optical system. Since the installation and removal of such a module generally entails sizeable outlay on assembly and adjustment, this filling option is primarily suitable in order to fill the cavity with the liquid for the first time when the optical system is being produced. After the module has been installed in the optical system, attempts should be made to prevent the ingress of air into the cavity, since otherwise the module will again have to be removed, tilted, filled and reinstalled in the original position.

During operation of the projection exposure apparatus, the cavity contained by the module will generally be bounded at the bottom by a lens, which may also be last optical element of the optical system from which light emerges during operation of the projection exposure apparatus. Here, the term "lens" is very generally intended to mean any transparent optical element, the optically active surfaces of which may also be plane-parallel. Nevertheless, a (deviating) mirror may also replace such a lower lens.

The module may contain further cavities, which may likewise be filled with liquid after tilting the module. In particular, two cavities may be separated from each other by a lens.

The module may contain a supply channel in order to introduce liquid into the cavity. A vent channel, which is independent of this, allows the air contained in the cavity to escape when the cavity is being filled. After filling, the vent channel may also be used to connect the liquid in the cavity to a liquid circuit by which the liquid can be cleaned, thermally regulated or treated in another way.

One or both channels may, for example, be arranged in the mounts of the optical elements which bound the cavity, or in an intermediate element arranged between these mounts.

If the optical system is an immersion objective and the concavely curved optical surface is the last optical surface of the immersion objective during operation of the projection exposure apparatus, then the cavity may be hermetically sealed by a releasably fastened closure element in the direction of an image plane of the immersion objective.

A module with such a closure element makes it possible to fasten and adjust the module, with the cavity filled outside the immersion objective, on the other parts of the immersion objective. If the closure element is subsequently immersed in the immersion liquid and then removed, the surrounding immersion will liquid prevent air from entering the cavity.

The cavity may also be filled initially with a different liquid, which is later replaced by the immersion liquid. It is furthermore possible to immerse the module with the filled cavity in a different liquid, and then to replace this later by the immersion liquid.

The closure element, which may for example contain a transparent plane-parallel plate, is preferably connected to a connecting part of the module so that it is not necessary to intervene externally in the narrow gap between the projection objective and the wafer, or a substitute plate, in order to remove the closure element immersed in the liquid. For this reason, it is favourable that a connection of the closure element to a connecting part for the module should be electrically, magnetically or hydromechanically releasable. The closure element can then be released from the module with the aid of an appropriate control signal, without this requiring mechanical work on the projection objective which could sometimes compromise a previously performed adjustment of the projection objective.

A hydromechanical connection may, for example, be produced when the closure element is fastened to the connecting part of the module by a reduced pressure that can be set up in the cavity. To this end, the cavity may be connected to a vacuum pump via a closable line. When the reduced pressure is relaxed, the closure element can drop out of the module under its own weight and be extracted laterally from the gap between the projection objective, on the one hand, and the wafer, a substitute plate or a trough for holding the immersion liquid. It may sometimes be necessary to increase the height of the gap in this case, for example by lowering the wafer relative to the fixed projection objective.

According to a second aspect of the invention, the object mentioned in the introduction is achieved by an optical system having a cavity which can be completely filled with a liquid and hermetically sealed, in which a concavely curved optical surface bounds the cavity at the top during operation of the projection exposure apparatus. A displacement element is arranged in the cavity and can be moved into a displacement position where the displacement element essentially bears seamlessly on the concavely curved optical surface.

The purpose of the displacement element is therefore to expel an air bubble lying below the concave surface out of the cavity. Full contact between the displacement element and the concavely curved optical surface is not absolutely necessary in this case since, if the gap is sufficiently narrow, capillary forces acting on a liquid will be so strong that the liquid is drawn into the gap while expelling the air still remaining there. The width of the gap should in this case preferably not exceed 0.5 mm, and more preferably 0.1 mm. In particular, the displacement element may have a curvature which is greater in magnitude than that of the concavely curved surface.

The displacement element may, for example, be a thin deformable membrane. The advantage of such a membrane is that it deforms when a pressure drop is generated and thereby bears accurately on curved surfaces.

In order to set up such pressure drops, the membrane may divide the cavity into a first subspace which is next to the concavely curved optical surface, and a second subspace which is not next to the concavely curved optical surface, it being possible for a positive pressure relative to the first subspace to be set up in the second subspace.

If the membrane bears on the concavely curved optical surface, and thereby displaces the air bubble accumulating there, then it is also necessary to ensure that the space between the membrane, on the one hand, and the concavely curved optical surface, on the other hand, is filled with liquid when the membrane is removed or retracted, so that air cannot enter this intermediate space again. To this end, for example, a supply line for a liquid may be positioned below the concavely curved optical surface so that liquid flowing out of the supply line fills the space between the membrane and the concavely curved surface.

As an alternative to this, the membrane may also be partially permeable for the liquid. After the membrane has been applied on the concavely curved optical surface, the liquid then passes gradually through the membrane. In order to promote access of the liquid through the membrane, a reduced pressure may be set up in the intermediate space between the concavely curved optical surface and the membrane, which on the one hand entrains air residues still remaining and also aids access of the liquid through the membrane.

As an alternative, the displacement element may also be a solid body having a surface which is at least essentially shaped as the negative of the concavely curved optical surface. Particularly complete removal of air residues which lie below the concavely curved optical surface can be achieved with such a displacement element. The supply of liquid into the intermediate space between the concavely curved optical surface and the displacement element may take place from the outside or through the displacement element.

Since the displacement element in the displacement position will generally lie in the light path of the optical system, it is necessary to ensure that the displacement element is removed after the cavity has been filled with liquid. Lateral movement out of the light path of the optical system is possible in principle, although this may entail not inconsiderable design problems.

Such problems can be avoided when the displacement element consists of a material which is soluble in a liquid. The displacement element can then be flushed out of the cavity with the liquid. This is particularly simple to do when the displacement element is a membrane. Dissolving the displacement element, however, is feasible only when the displacement element is not intended to be used repeatedly for filling the cavity with a liquid.

A displacement element may also be used when the lens, which has a surface curved concavely upwards on the image side, is the last optical element on the image side of an immersion objective. In this case as well, the displacement element may be a deformable membrane which, for example, is deformed by generating a positive pressure on a side facing away from the lens and thereby displaces air present below the concavely curved optical surface. There may for this purpose be a pressure space, which can be filled with a gas or a liquid, next to the membrane on a side facing away from the lens.

In principle, it is also possible to provide the pressure space at the end of the immersion objective. The design outlay for this, however, is very great. It is therefore simplest for the membrane and the pressure space to be held in a movable substrate stage for moving a substrate, which carries a layer to be exposed. Absolutely no structural modifications then need to be carried out on the immersion objective in order to deform the membrane.

It is also feasible to use a solid body, having a surface which is shaped as the negative of the concavely curved optical surface, as the displacement element instead of a membrane. Such a displacement element may, for example, be transferred into the displacement position by vertical movement.

The displacement element may likewise be held in a resting position in a movable substrate stage.

According to a third aspect of the invention, the object mentioned in the introduction is achieved in that the optical system comprises a channel with an opening, which can be positioned immediately next to the apex of the curved surface before operation of the projection exposure apparatus. Since the air below the concavely curved optical surface always accumulates at the apex, if the symmetry axis extends vertically, the air can be coextracted from there out of the cavity via the channel. If the opening of the channel is close enough to the apex, then even very small air bubbles can still be effectively removed in this way.

In general, when the cavity is being filled, the liquid rising in the cavity will expel the air lying above the liquid level. The channel may, however, also be connected to a gas pump for pumping away gas which accumulates below the optical surface.

Instead of letting the air below the apex escape via the channel, liquid may also be introduced below the optical surface via the channel with the aid of a liquid pump. The liquid introduced below the apex then displaces and entrains the air present there. This way of entraining air bubbles performs best when the liquid has a high viscosity. In this case, the air bubbles are entrained by the liquid stream even if it has a relatively low flow rate. When liquid is supplied below the apex via the channel and liquid is simultaneously sucked out at the edge of the lens, then the air bubbles will be carried away beyond the edge of the lens by the liquid.

In order to position the channel below the lens before operation of the projection exposure apparatus, so that the opening is positioned immediately next to the apex, the channel may comprise a first subsection and a second subsection, which is connected to the first subsection via an articulation, the subsections being tiltable relative to each other via the articulation. The channel is then, for example, pushed into the'cavity through an opening in the lens mount. The outer subsection is then aligned with the aid of the articulation so that the opening is positioned immediately next to the apex of the surface. After the cavity has been filled, the outer subsection is replaced so that the channel can be removed again from the cavity.

The use of an articulation generally requires an additional mechanism in order to be able to tilt the two subsections relative to each other from the outside. In an alternative embodiment, the channel therefore contains a material which has a shape memory. In this way, it is possible to modify the shape of the channel by temperature changes, so as to achieve alignment of the channel in the cavity.

The channel may also be designed as a rigid curved tube which can be inserted into the cavity, for example via an opening in a lens mount or—in the case of an immersion cavity—below the lower edge of the lens. If the curvature and length of the tube are suitable, then the opening of the tube will move close to the apex during the insertion movement owing to its curvature.

Similarly as the aforementioned displacement element, the channel may likewise be soluble in a liquid, which sometimes makes it easier to remove the channel after filling with the liquid.

Instead of an external channel, it is also possible to provide a channel which extends inside the lens and has a first opening and a second opening, the first opening being situated at the apex of the optical surface. This ensures that an opening, via which air can escape from the cavity or liquid can be introduced into the cavity, is positioned not just immediately next to but directly at the apex of the concavely curved surface. Air accumulating there can be discharged particularly well in this way, or a liquid which entrains and carries away air accumulating at the apex can be introduced particularly well via the first opening.

This solution is feasible primarily when the beam path of the optical system does not extend symmetrically with the optical axis, as may be the case for example in projection objectives with an off-axial field. In this case, it is sometimes possible to ensure that no light rays pass through the lens in the region of the channel.

The second opening of the channel may be arranged at the apex of the opposing surface of the lens, or arranged externally at an edge of the lens. In the latter case, the channel extends in the radial direction through the lens. The advantage of this configuration is that devices which collect the air emerging from the second opening, or which introduce liquid through the second opening, do not need to be arranged in the space above the lens.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
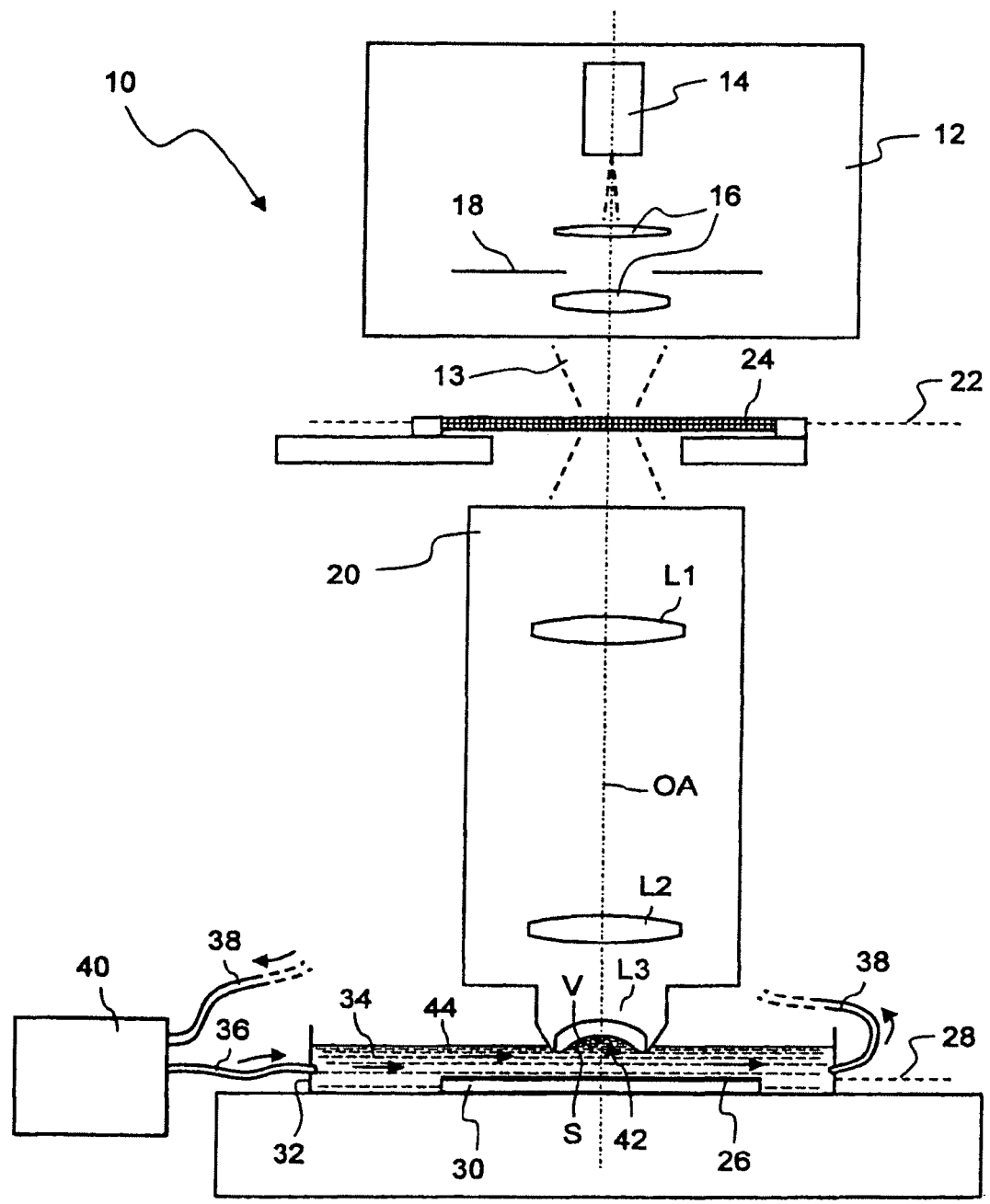
FIG. 1 shows a schematic representation of a projection exposure apparatus with an illumination system and a projection objective in a meridian section.

FIG. 1 shows a meridian section through a microlithographic projection exposure apparatus, denoted overall by 10, in a highly simplified schematic representation. The projection exposure apparatus 10 has an illumination device 12 for generating projection light, which inter alia contains a light source 14, illumination optics indicated by 16 and a field plane 18. In the exemplary embodiment which is represented, the projection light 13 has a wavelength of 193 nm. It is of course also possible to use other wavelengths, for example 157 nm or 248 nm.

The projection exposure apparatus 10 furthermore includes a projection objective 20, which contains a multiplicity of optical elements such as lenses, mirrors or filter elements. Three lenses L1, L2 and L3 are represented in FIG. 1 to represent these generically. The projection objective 20 is used to image a mask 24, which is arranged in an object plane 22 of the projection objective 20, onto a photosensitive layer 26 which may consist of a photoresist, for example. The photosensitive layer 26 is arranged in an image plane 28 of the projection objective 20 and is applied on a support 30.

The support 30 is fastened on the bottom of an open-topped container 32 in the form of a trough, which can be moved parallel to the image plane 28 with the aid of a travelling device (in a way which is not represented in detail). The container 32 is filled sufficiently with an immersion liquid 34 so that the projection objective 20 is immersed with its last lens L3 on the image side in the immersion liquid 34 during operation of the projection exposure apparatus 10.

Via a supply line 36 and a discharge line 38, the container 32 is connected to a treatment unit 40 which contains a circulating pump, a filter for cleaning the immersion liquid 34 and a temperature regulating device, in a manner which is known per se and is therefore not represented in detail.

In the exemplary embodiment which is represented, the lens L3 is a thick meniscus lens which has a concavely curved surface S in the direction of the image plane 28. A cavity 42 is therefore formed between the surface S and the photosensitive layer 26.

Owing to the concave curvature of the last surface S, only relatively small ray angles of incidence occur at the interface between the last lens L3 on the image side and the immersion liquid 34. Reflection losses at this interface are therefore correspondingly small. Rays with large aperture angles with respect to an optical axis OA of the projection objective 20 can thus also contribute to the imaging, so that the projection objective 20 can achieve numerical apertures which may extend up to the refractive index $n_L$ of the immersion liquid 34.

If the container 32 filled with the immersion liquid 34 were to be brought up to the projection objective 20 from below before the projection exposure apparatus 10 is put into operation for the first time, then the immersion liquid 34 would fill only a relatively small volume in the cavity 42. This is due to the fact that the air which surrounds the projection exposure apparatus 10, and which is also situated below the surface S before the projection exposure apparatus 10 is put into operation, has no opportunity to escape from the cavity 42.

If the level of the immersion liquid 34 as denoted by 44 in FIG. 1 increases, the air in the cavity 42 will be slightly compressed and form an air bubble immediately below the apex of the concave surface S, which is denoted by V. Even if its dimensions are very small, such a bubble will be intolerable during operation of the projection exposure apparatus 10 since it would significantly impair the imaging properties. The same applies if, conversely, the projection objective 20 is immersed from above in the container 32 filled with immersion liquid 34.

Figure 2:
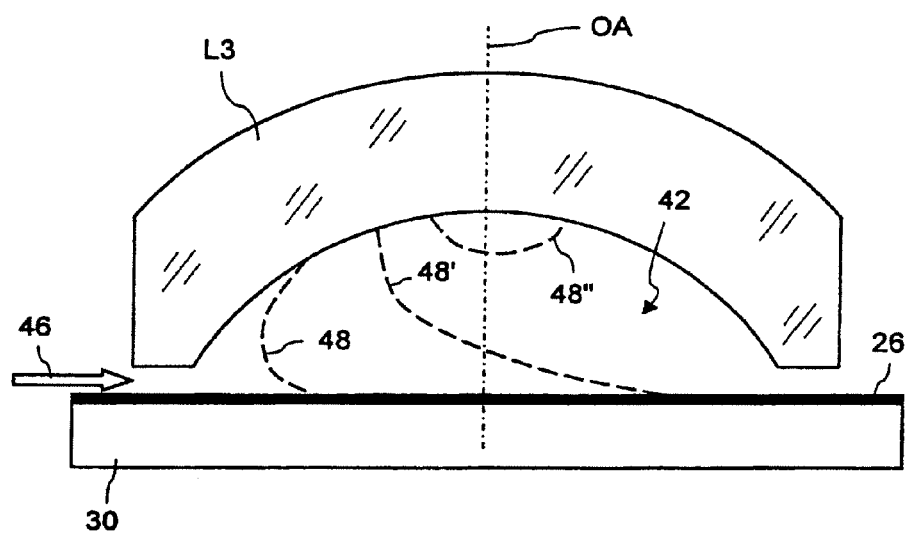
FIG. 2 shows the image-side end of the projection objective shown in FIG. 1.

An air bubble below the surface S is also unavoidable if the cavity 42 is filled from only one side. This is schematically shown in FIG. 2, where the last lens L3 and the photosensitive layer 26 are represented on an enlarged scale. If immersion liquid 34 is introduced from the left through the gap between the lens L3 and the photosensitive layer 26, in the direction indicated by an arrow 46, then the immersion liquid can rise up to the concave surface S because of capillary forces, as indicated in FIG. 2 with an interface 48 represented by dashes.

When the cavity 42 is filled further, the interface 48 moves to the opposite side from the place of introduction, as indicated by a second interface 48'. At a yet later time, however, the immersion liquid closes the gap between the last lens L3 and the photosensitive layer 26, so that the remaining air is trapped in the cavity 42.

The air still remaining in the cavity 42 can therefore no longer escape, but owing to the upthrust it accumulates below the highest point of the cavity, i.e. close to the apex V of the surface S, where it forms an air bubble whose interface is denoted by 48" in FIG. 2.

The inclusion of such an air bubble can in principle be avoided by initially turning the entire projection objective 20 upside down, then filling the cavity 42 with the immersion liquid 34, hermetically closing the cavity 42 by a plate or the like, returning the projection objective 20 into its operating position, and removing the plate when the projection objective 20 is immersed in the container 34. This, however, places such stringent requirements on the adjustment accuracy of the projection objective 20 that tilting the projection objective 20 would entail full readjustment. This is impracticable for reasons of cost and time.

Various possible ways of avoiding the inclusion of air below a concavely curved surface when filling with a liquid will be described below.

1. Tiltable Module

Figure 3:
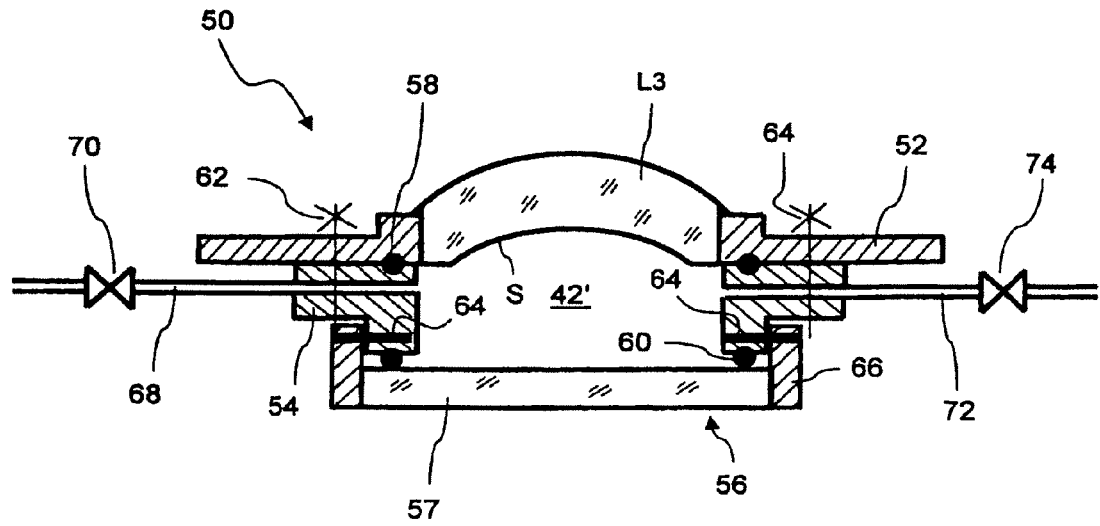
FIG. 3 shows a module with the last lens on the image side of the projection objective shown in FIG. 1, and a cavity bounded thereby, according to a first exemplary embodiment of the invention.

FIG. 3 shows a schematic axial section of a module 50, which forms an independent structural unit and can be connected as a whole to the other parts of the projection objective 20. The module 50 comprises the last lens L3 on the image side, an annular mount 52 which holds the lens L3, an intermediate ring 54 and a closure element 56. The closure element 56 contains a socket 66, in which a plane-parallel glass plate 57 is centrally fitted.

The lens L3, the mount 52, the intermediate ring 54 and the closure element 56 enclose a cavity 42', which is intended to hold the immersion liquid. In order to seal the cavity 42', sealing elements 58, 60 are provided which respectively extend between the mount 52 and the intermediate ring 54 and between the intermediate ring 54 and the closure element 56. The mount 52 is connected to the intermediate ring 54 with the aid of screws 62, 64.

The connection of the closure element 56 to the intermediate ring 54 is designed so that it can be released either with the aid of an actuator, for example a hydromechanical, electrical or magnetic switch, or from the side. In FIG. 3, the connection between the closure element 56 and the intermediate ring 54 is indicated by connecting pins 64, which can be inserted into the intermediate ring 54 through bores in the socket 66. In the simplest case, the connecting pins 64 can be extracted from the side by a suitable tool, so as to release the connection between the intermediate ring 54 and the closure element 56. If the connection is intended to be released with the aid of an actuator, then such an actuator may for example act on the connecting pins 64 in a manner which is known per se.

The intermediate ring 54 contains a first channel 68 with a first shut-off valve 70 and, lying opposite, a second channel 72 with a second shut-off valve, so that the two openings of the channels 68, 72 which point towards the cavity 42' approximately lie diametrically opposite each other. In principle, however, other arrangements of the channels 68, 72 are conceivable. It is in principle even possible to make the two channels 68, 72 open into the cavity 42' immediately next to each other.

The function of the module 50 will be explained below with reference to FIGS. 4 to 8:

The module 50 is first mounted and adjusted fully, so that the cavity 42' is accessible only via the first and second channels 68 and 72.

Figure 4:
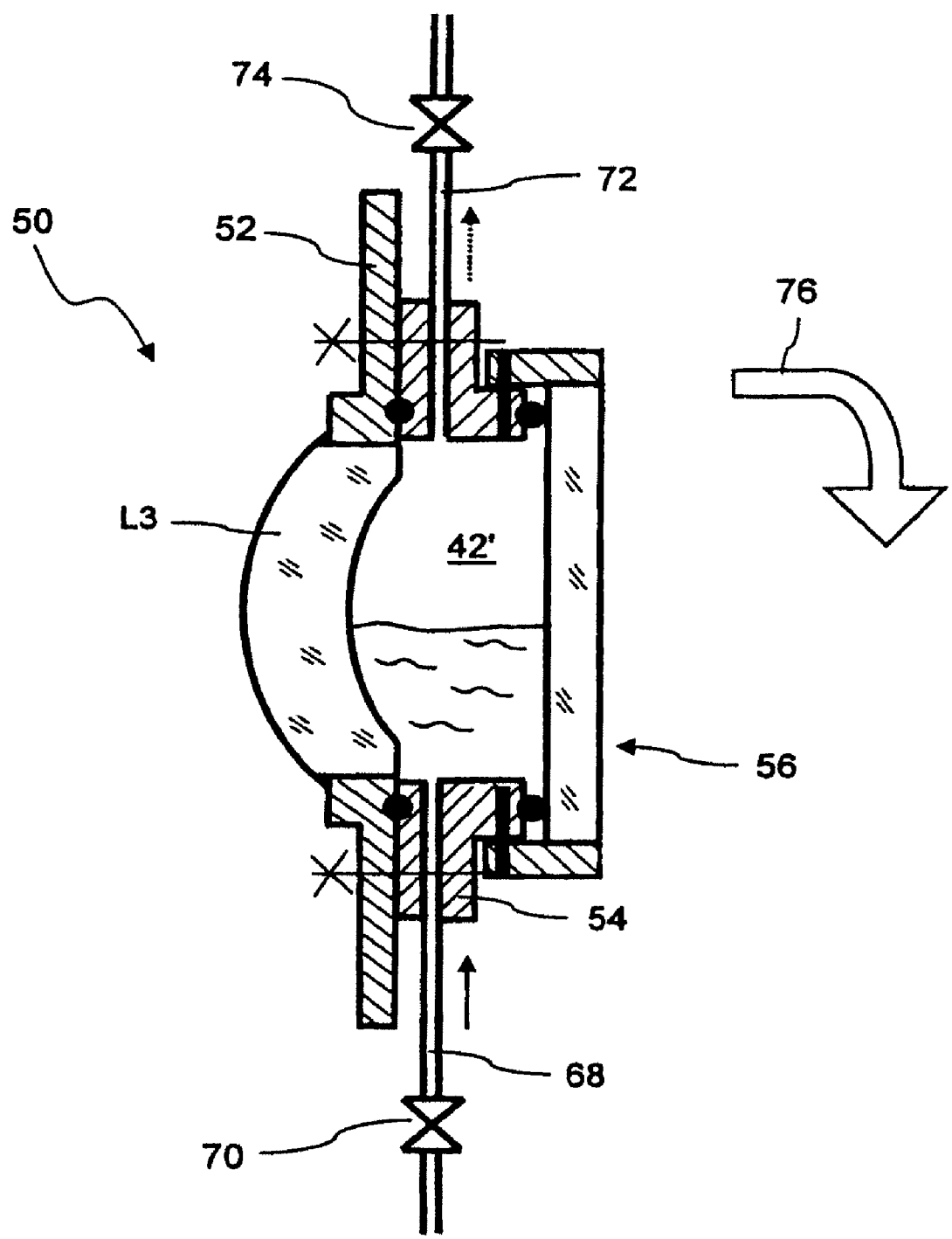
FIG. 4 shows the module shown in FIG. 3, but tilted through 90°, and a cavity partially filled with immersion liquid.

The entire module 50 is then tilted through approximately 90°, and therefore brought into a position where the opening of the second channel 72 lies at least approximately at the highest point of the cavity 42', as shown in FIG. 4. In this position, the first channel 68 is connected to a reservoir for the immersion liquid 34.

The two shut-off valves 70, 74 are then opened. With the aid of a pump (not shown in FIG. 4), the immersion liquid 34 is pumped out of the reservoir via the first channel 68 from below into the cavity 42'. The immersion liquid 34 which rises in the cavity 42' during the pumping process thereby displaces the air lying above the immersion liquid 34. Owing to the approximately vertical arrangement, the accumulating air can escape out via the second channel 72.

The cavity 42' continues to be filled with immersion liquid 34 until the immersion liquid 34 rises through the second channel 72 and emerges at the end of the second channel 72, after having passed the second shut-off valve 74. This may be detected, for example, by using a suitable detector. The two shut-off valves 70, 74 are then closed. The entire cavity 42', including the channel sections as far as the shut-off valves 70, 74, is then filled bubble-free with the immersion liquid 34.

The entire module 50 is now tilted back into its original horizontal position, as indicated by an arrow 76 in FIG. 4. In this horizontal position, the module 50 with the filled cavity 42' is fastened and adjusted on the connecting part 77 at the lower end of the projection objective 20. In the schematic representation of FIG. 5, the fastening is indicated by a screw connections 79, 81. Since the closure element 56 contains the transparent plate 57, it is possible to adjust the module 50 relative to the other parts of the projection objective 20 with the aid of optical measuring instruments.

Figure 5:
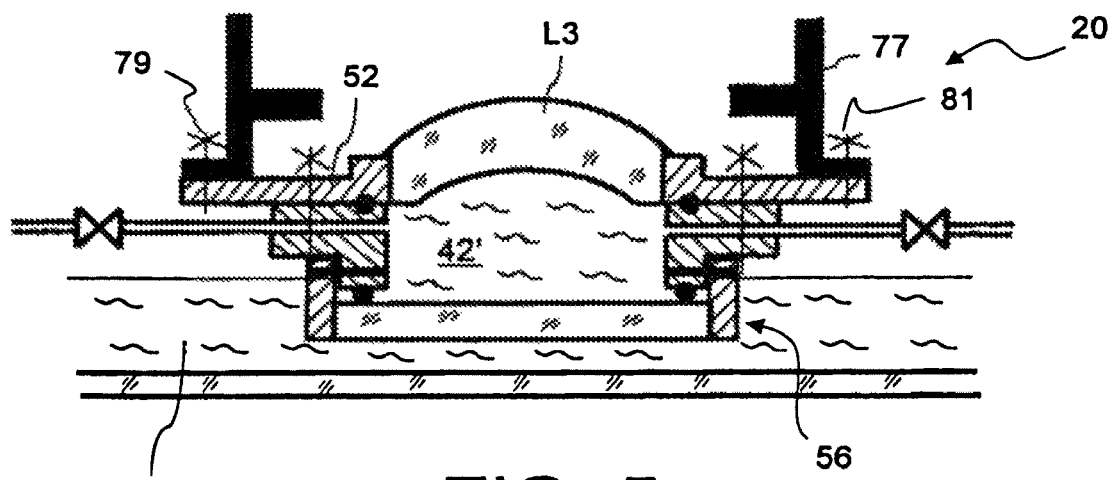
FIG. 5 shows the module of FIG. 3 in the installed state at the image-side end of the projection objective.

Before the projection exposure apparatus 10 is put into operation, the intermediate space between the module 50 and the photosensitive layer, or a movable substrate stage, is filled with the immersion liquid 34. The container 32 should in this case be filled with the immersion liquid 34 so that the immersion liquid 34 extends beyond the lower edge of the intermediate ring, as can be seen in FIG. 5.

In a subsequent step, the closure element 56 is then released from the intermediate ring 54 manually or with the aid of an optionally provided actuator. The closure element 56 descends through the surrounding immersion liquid 34 owing to its higher density, and can be extracted laterally from the intermediate space between the projection objective 20 and the movable substrate stage. This is indicated by an arrow 78 in FIG. 6.

The liquid 34 in the cavity 42' could in fact flow out downwards when the closure element is 56 being removed, so as to reach a uniform filling height. Outflow is prevented, however, because no air that could replace the outflowing immersion liquid 34 can enter the cavity 42'. The cavity 42' therefore remains completely filled with the immersion liquid 34 so long as the two shut-off valves 70, 74 remain closed.

In the exemplary embodiment shown in FIG. 1, it is assumed that the projection objective 20 is immersed in a container 32 filled with the immersion liquid 34. For immersed operation, however, it is sufficient merely for the narrow intermediate space between the last lens L3 on the image side and the photosensitive layer 26 to be filled with immersion liquid 34. If this is intended, then the surrounding immersion liquid 34 may be discharged starting from the state shown in FIG. 6, so as to reach the state shown in FIG. 7. Complete outflow of the immersion liquid 34 from the cavity 42 is here again prevented by the fact that no air can flow back in from above.

The projection exposure apparatus 10 can now commence the projection operation.

Figure 6:
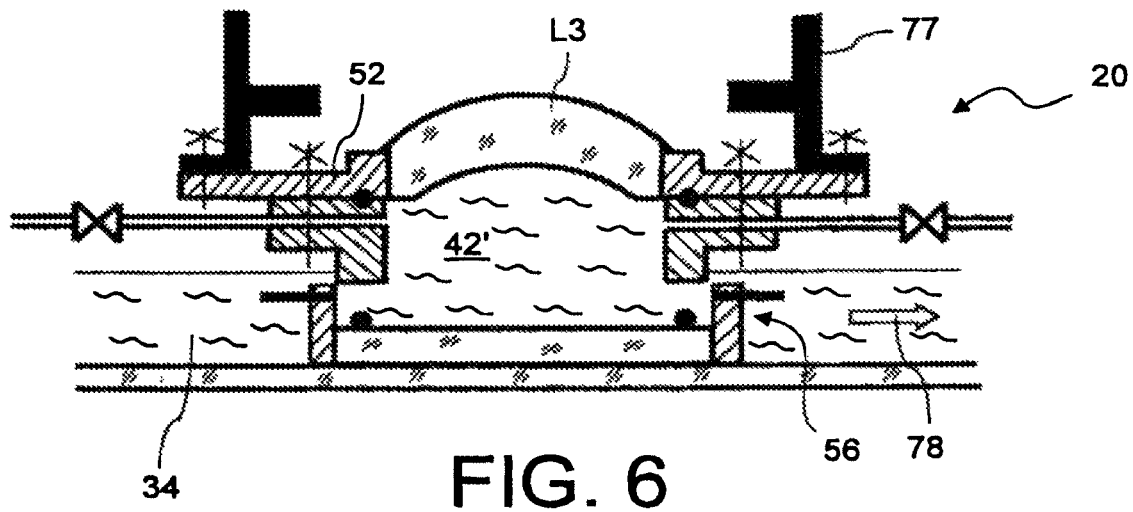
FIG. 6 shows the module of FIG. 5, but with a released closure element.
Figure 7:
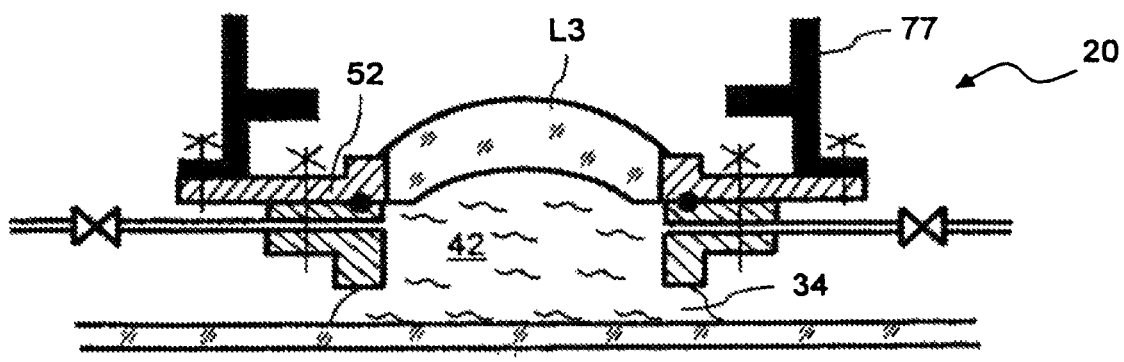
FIG. 7 shows the module of FIG. 5 in the state ready for operation.

FIG. 8 again shows the steps explained with reference to FIGS. 5 to 7 in an overview representation, in which a single movable substrate stage 80 is shown for all the method steps for the sake of simplicity.

Figure 8:
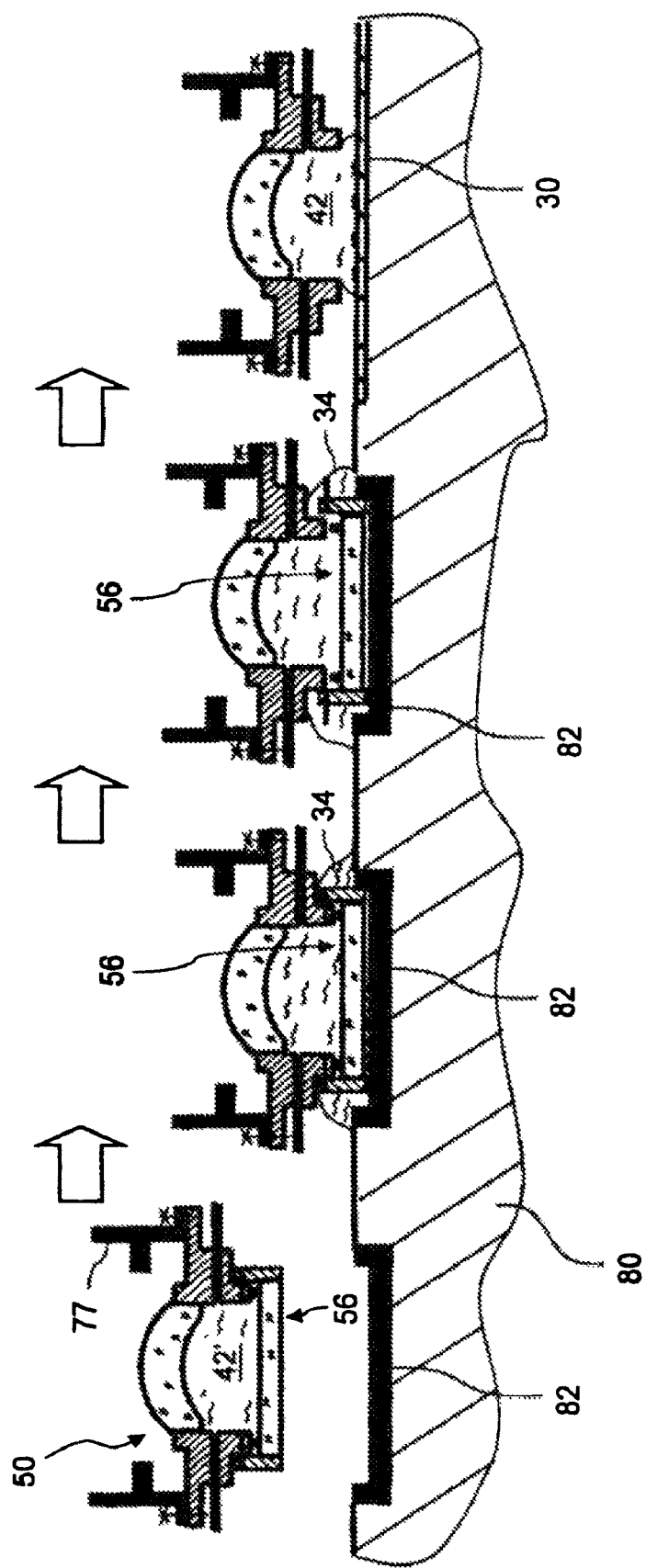
FIG. 8 shows essential steps before the module shown in FIG. 3 is put into operation.

The very left of FIG. 8 shows the module 50, which is screwed to the connecting part 77 and whose cavity 42' is filled with the immersion liquid 34. At this point, it is assumed that the movable substrate stage 80 is lowered in order to avoid contact with the closure element 56.

The second partial representation from the left shows the state after the movable substrate stage 80 has been raised and the intermediate space between the movable substrate stage 80 and the projection objective 20 has been filled with immersion liquid 34. The movable substrate stage 80 is provided with a recess 82 which is used to receive the closure element 56.

The next partial representation on the right shows the state after the closure element 56 has been released from the intermediate ring 54 and descended through the immersion liquid 34 into the recess 82.

The movable substrate stage 80 is now moved laterally, so that the recess 82 with the closure element 56 held in it is moved laterally out of the working region of the projection objective 20. The movable substrate stage 80 is then moved further so that the support 30 with the photosensitive layer 46 applied on it enters the working region of the projection objective 20. This state is shown on the far right in FIG. 8.

Figure 9:
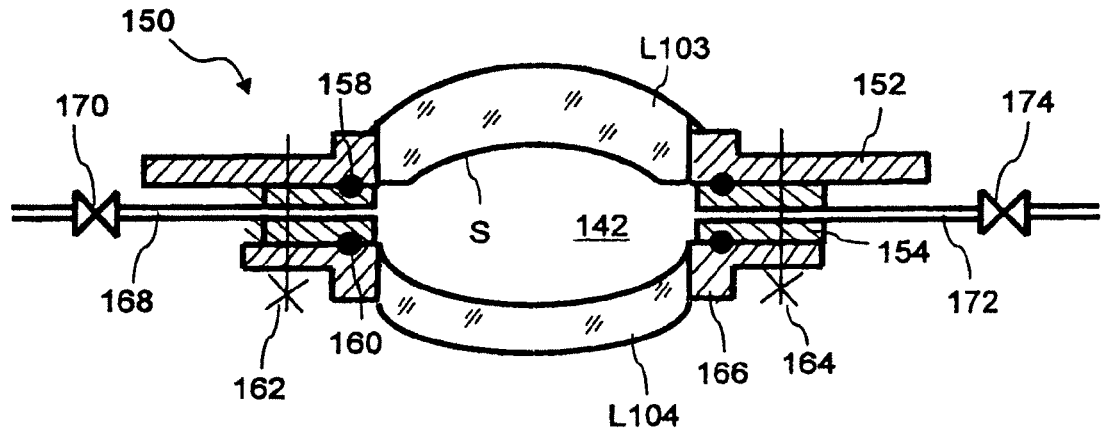
FIG. 9 shows a module with two lenses enclosing a cavity, according to a second exemplary embodiment of the invention.

The principle which was explained above with reference to the exemplary embodiment shown in FIGS. 3 to 8 can also be applied to the case when the concavely curved surface which is in contact with a liquid is not the last surface of the optical system. Exemplary embodiments of this will be explained below with reference to FIGS. 9 to 14:

In a representation corresponding to FIG. 3, FIG. 9 shows a module 150 which contains a first meniscus lens L103 with a concave surface S and a second meniscus lens L104. The module 150 is installed in the illumination system 10 or the projection objective 20 so that the concave surface S curves upwards.

The first lens L103 is held in a mount 152, which is connected via an intermediate ring 154 to a second mount 166 for the second lens L104. In FIG. 9, screws 162, 164 are shown as common connecting elements for the mounts 152, 166 and the intermediate ring 154. The lenses L103, L104, the intermediate element 154 and the two mounts 152 and 166 enclose a cavity 142, which is intended to hold a liquid. To this end, the cavity is sealed by sealing elements 158, 160. The intermediate ring 154 contains a first channel 168 with a first shut-off valve 170 and, lying opposite, a second channel 172 with a second shut-off valve 174.

The module 150 therefore differs from the module 50 shown in FIG. 3 essentially in that the closure element 56 releasably connected to the intermediate ring 54 is replaced by a lens L104 held in the mount 166.

Figure 10:
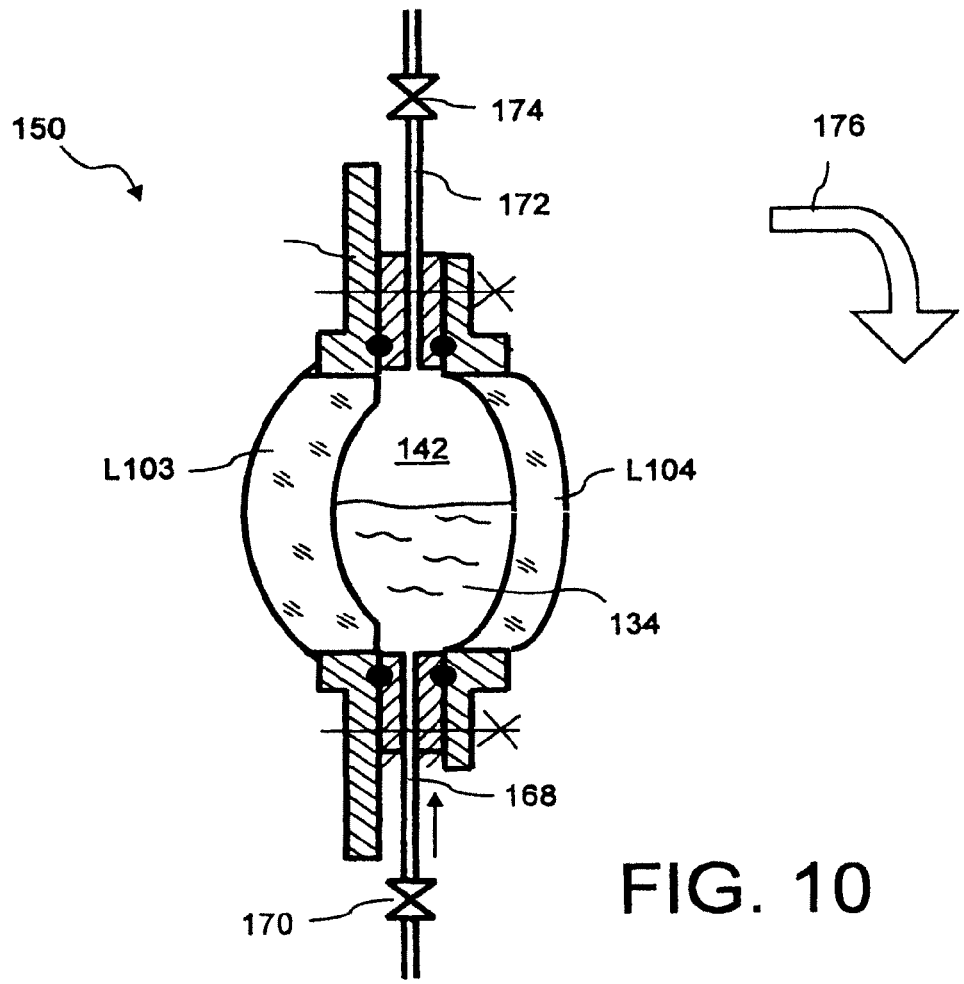
FIG. 10 shows the module shown in FIG. 9, but tilted through 90°, and with a cavity partially filled with a liquid.

In order to fill the cavity 142 with a liquid, the module 150 is tilted into a vertical position as shown in FIG. 10. The filling with a liquid is here again preferably carried out by opening the two shut-off valves 170, 174 and pumping a liquid 134 into the cavity 142 from below. The air lying above the liquid level then escapes via the second channel 172.

Figure 11:
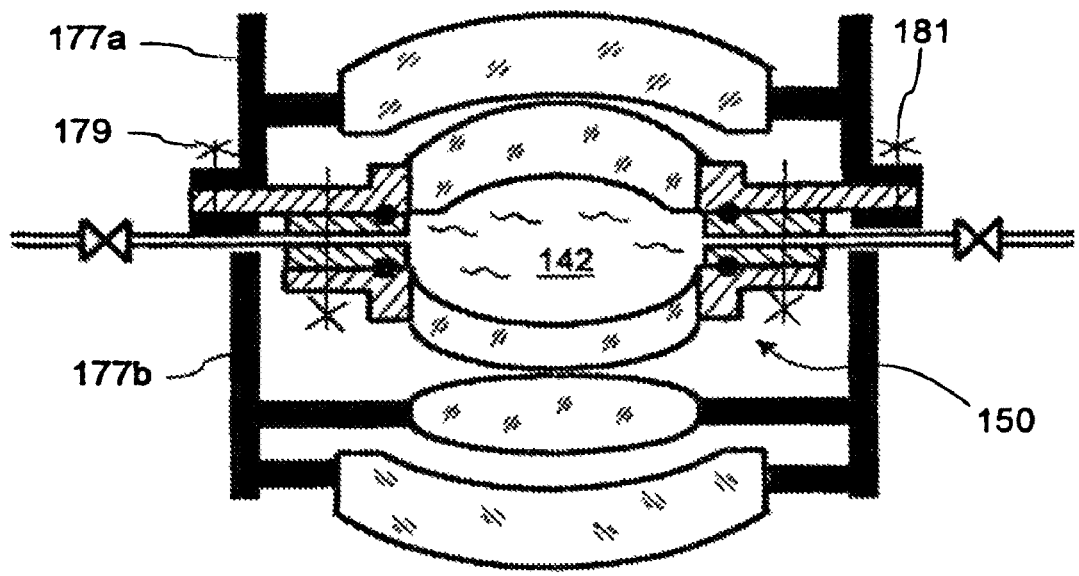
FIG. 11 shows the module of FIG. 3 in the installed state in an optical system.

After filling has been carried out, the module 150 is tilted back into the horizontal position shown in FIG. 9, as indicated by an arrow 176 in FIG. 10. The module 150 filled in this way is then installed in the optical system in a manner which is known per se, and adjusted there. The installed state of the module 150 is shown in FIG. 11. Screw connections 197, 181 indicate adjustable connection of the module 150 to adjoining parts 177a, 177b of the optical system.

Figure 12:
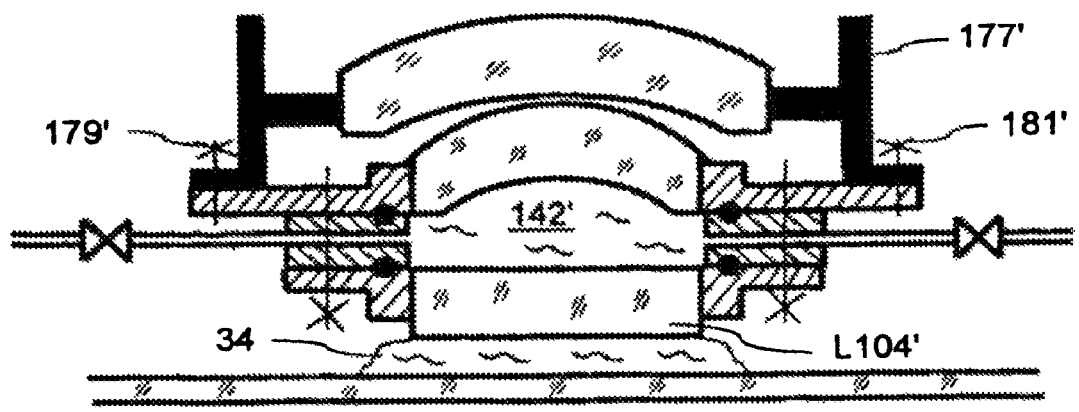
FIGS. 12 to 14 show variants of the module shown in FIG. 9.

The lens L104, which bounds the cavity 142 at the bottom in the installed state, may also be a plane-parallel plate L104' with no refracting power, as shown in FIG. 12. Such a plane-parallel plate L104' is often used as the last optical element of an immersion objective. The plate L104' therefore adjoins both the liquid in the cavity 142' and the immersion liquid 34.

Figure 13:
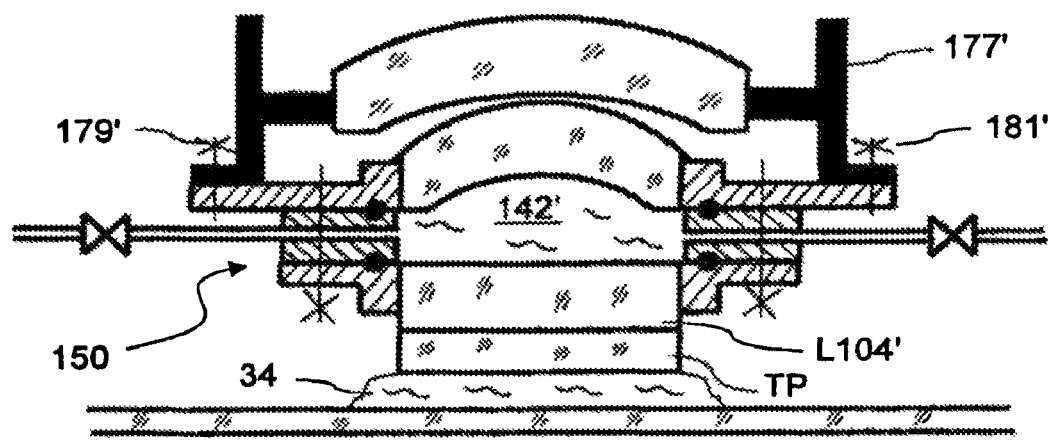

There may be a replaceable terminating plate TP next to the plate L104', as shown in FIG. 13. Such a terminating plate TP is favourable particularly when the immersion liquid 34 is so chemically corrosive that it attacks the surfaces of optical elements. Since replacing the plate L104', as shown in FIG. 12, would require removal of the entire module 150, it is generally simpler for the terminating plate TP to be contact bonded or fastened in another way on the plate L104'. The terminating plate TP can then be replaced quite easily as soon as it shows initial degradation phenomena due to contact with the immersion liquid 34.

Figure 14:
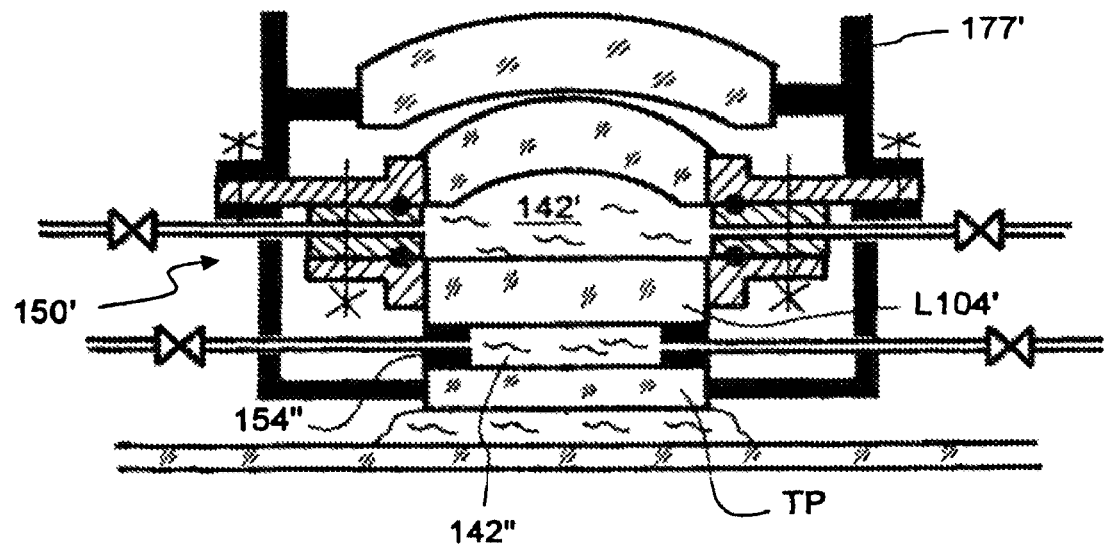

FIG. 14 shows an exemplary embodiment in which the terminating plate TP is not immediately next to the plane-parallel plate L104', but is separated from it by a likewise liquid-filled intermediate space 142". In this embodiment, therefore, the module 150' is supplemented by the terminating plate TP as well as an intermediate ring 154", which separates the terminating plate TP from the plate L104' and laterally bounds the second cavity 142". Before installation in the projection objective 20, the entire module 150 can be transferred in the aforementioned way into a vertical position, where the two cavities 142', 142" can be filled without air being trapped. Since the second cavity 142" is not bounded at the top by a concave surface, however, it could also be filled in the horizontal position shown in FIG. 14 so long as there is a channel intended for air venting immediately next to the lower edge of the plate L104'.

2. Displacement Element

Figure 15:
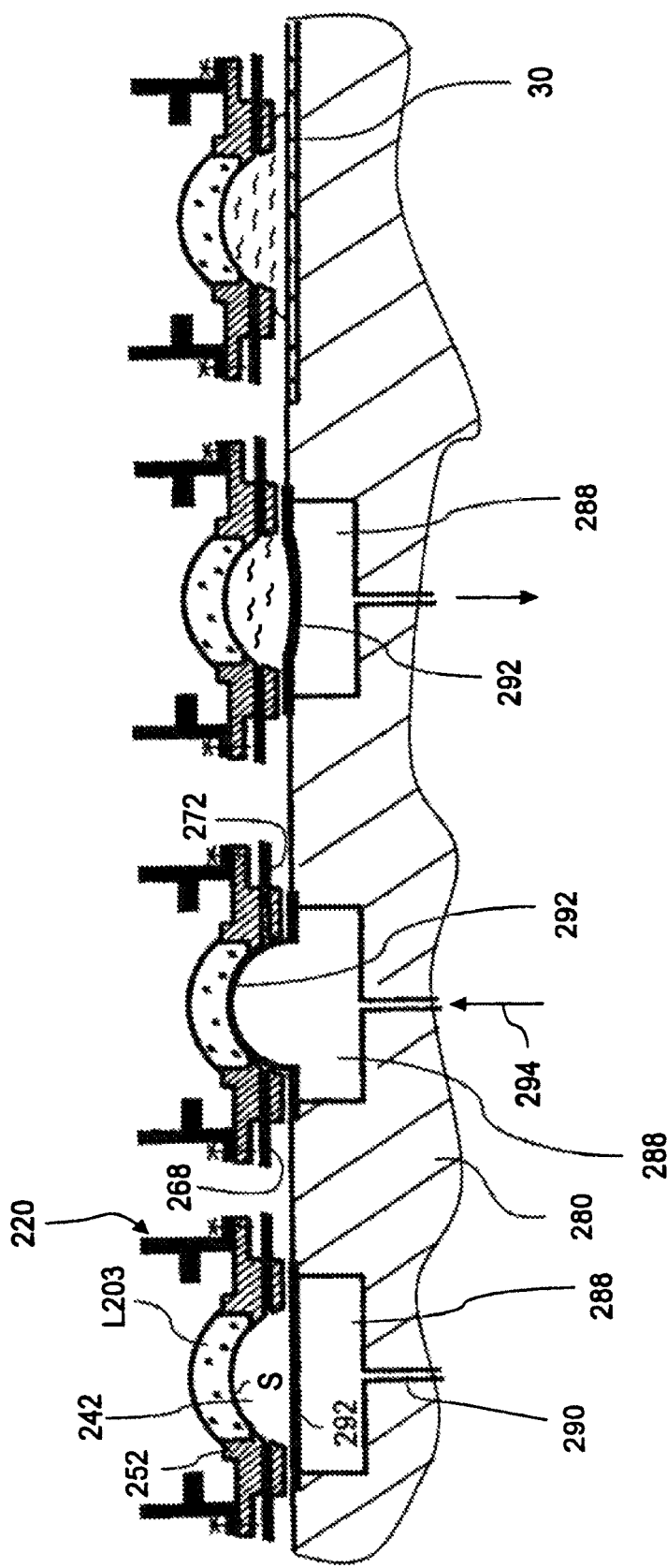
FIG. 15 shows the image-side end of an immersion objective with a membrane as the closure element, according to a third exemplary embodiment of the invention.

In a representation analogous to FIG. 8, FIG. 15 shows a further exemplary embodiment according to a second aspect of the invention.

FIG. 15 shows the object-side section of an immersion objective 220, which is constructed in principle like the immersion objective 20 shown in FIG. 1. A last lens L203 on the image side has a concave surface S on the image side, which, together with a lens mount 252 and a movable substrate stage 280, bounds a cavity 242. The cavity 242 is intended to be filled with an immersion liquid during operation of the projection objective 220.

The movable substrate stage 280 contains a pressure chamber 288', which is connected via a pressure channel 292 to a pressure pump (not shown in FIG. 15). In the direction of the projection objective 220, the pressure chamber 228 is closed hermetically by a deformable membrane 292.

In order to actuate the pressure pump, a positive pressure is set up in the pressure chamber 288. In FIG. 15, the supply of gas into the pressure chamber 288 is indicated by an arrow 294 in the second partial representation from the left. The membrane 292 deforms owing to the positive pressure prevailing in the pressure chamber 288, so that it bears almost seamlessly on the surface S of the last lens L203 on the image side. Air contained in the cavity 242 is therefore displaced by the membrane 192. The displaced air escapes via the circumferential gap between the lens mount 252 and the membrane 292. As an alternative to this, a channel contained in the lens mount 252 may also be opened in order to let air escape via the channel. A first channel 268 and a second channel 272 are provided in the exemplary embodiment shown in FIG. 15, both of which can be used for this purpose.

Immersion liquid is then pumped under pressure via the first channel 268 into the narrow gap between the lens mount 252 and the membrane 292. The second channel 272 is opened at the same time. When immersion liquid flows into the first channel 268, then it displaces air residues still remaining at the level of the channel opening, which can escape via the second channel 272. The positive pressure in the pressure chamber 288 is then gradually reduced, so that the immersion liquid flowing in via the first channel 268 presses the membrane 292 back again until it reaches approximately a position as shown in the third partial representation from the left in FIG. 15. The entire cavity 242 is now filled with the immersion liquid 34.

The movable substrate stage 280 is then moved laterally so that the pressure chamber 288, with the membrane 292 lying above, is replaced by the support 30 for the photosensitive layer 26. The projection exposure apparatus is now ready for the projection operation.

Figure 16:
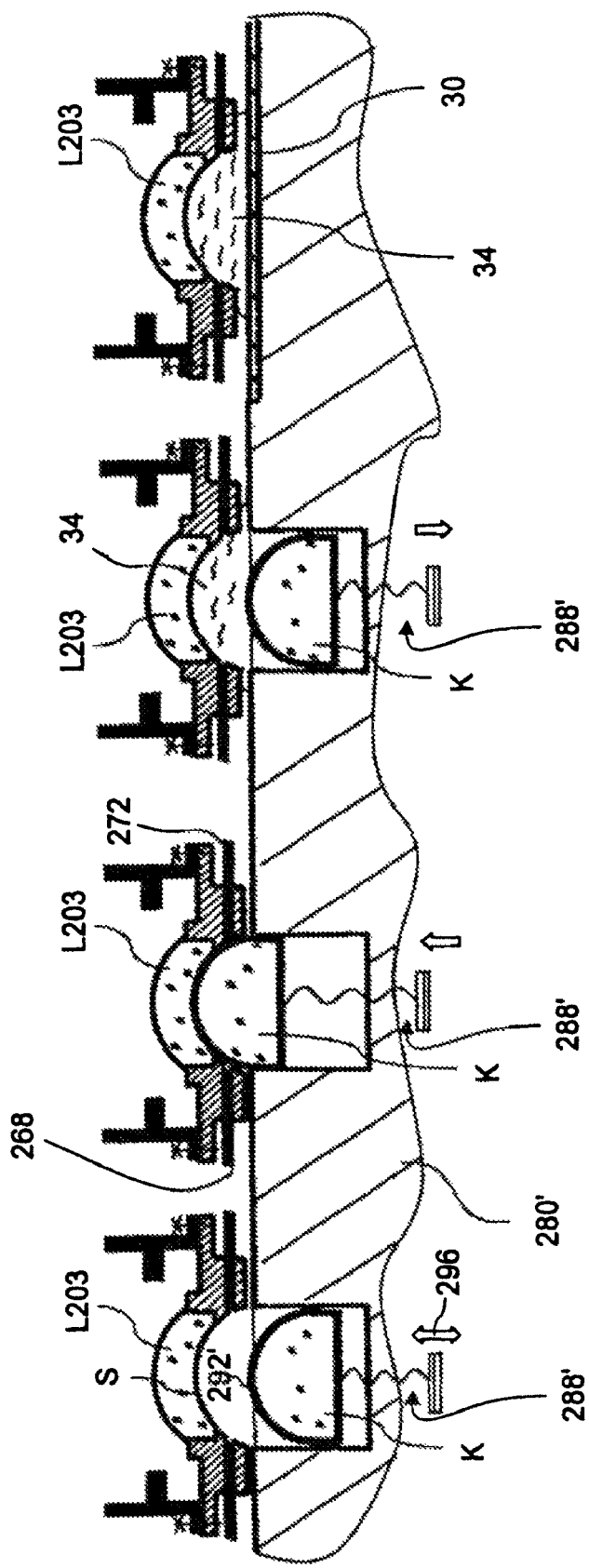
FIG. 16 shows the image-side end of an immersion objective with a solid body as the closure element according to a fourth exemplary embodiment of the invention.

FIG. 16 shows a further exemplary embodiment, which likewise employs the principle of the displacement element. It differs from the exemplary embodiment shown FIG. 15 primarily in that the membrane 292, which can be deformed by means of a positive pressure, is replaced by a solid displacement body K. Facing the lens L203, the displacement body K has a concave surface 292' which is designed essentially in a complementary way to the concavely curved surface S of the lens L203. The displacement body K can be moved in a vertical direction with the aid of an actuator, which is indicated by a spring drive 288', as indicated by a double arrow 296 in FIG. 16.

The filling of the cavity 242 below the lens L203 is carried out in the same way as explained above with reference to the exemplary embodiment shown FIG. 15:

First, the displacement body K is moved out of the movable substrate stage 280 with the aid of the actuator 288' until the convex surface 292' bears directly on the concave surface S of the lens L203. This state is represented in the second partial representation from the left in FIG. 16. While the displacement body K is being raised, the air situated in the cavity 242 is displaced as described in detail above.

Immersion liquid 34 is now introduced under pressure via the first channel 268. Any residual air still present will therefore be displaced and discharged via the second channel 272. The displacement body K is then moved back into its original lower travelling position, either by active use of the actuator 288' or merely owing to the immersion liquid flowing in under pressure, as shown in the third partial representation of FIG. 16. The movable substrate stage 280' is subsequently moved laterally so that the support 30 for the photosensitive layer 26 is brought in contact with the immersion liquid 34.

For the complete displacement of air which lies below the concavely curved surface S, the displacement body K must not touch the surface S. This is important in so far as the concavely curved surface S is manufactured with high precision, so that the damage could occur in the event of contact with the displacement body K.

Figure 17:
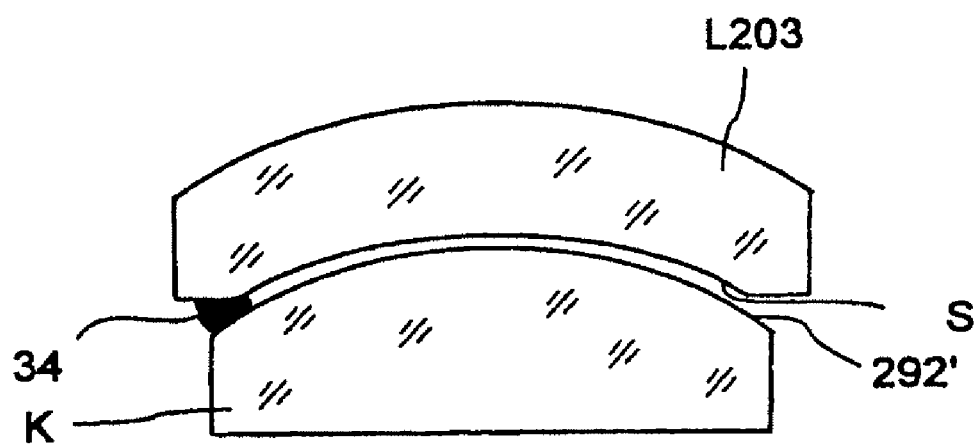
FIGS. 17 and 18 show the displacement of a liquid into a gap between a concavely curved lens and the body shown in FIG. 16.
Figure 18:
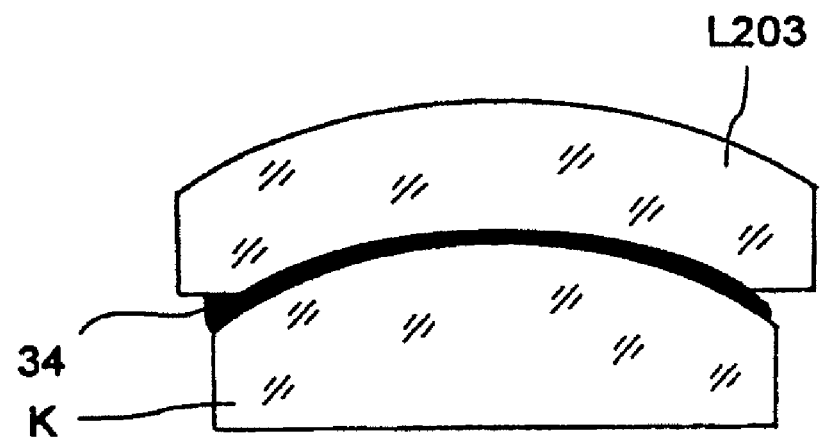

FIG. 17 shows the situation which prevails between the last lens L203 and the displacement body K when immersion liquid 34 is introduced from the side, without contact between the two mutually opposing surfaces S and 292' of the lens L203 and the displacement body K, respectively. If further immersion liquid 34 is introduced beyond the filling stage shown in FIG. 17, then the effect of the capillary forces between the immersion liquid 34 and the adjoining surfaces S, 292' is that the immersion liquid 34 is drawn into the gap remaining between the surfaces S, 292' and displaces the residual air present there in spite of its upthrust. The residual air may then be discharged from the cavity 242, for example via the second channel 272 (see FIG. 16). Before the displacement body K is retracted, the entire gap between the two surfaces S and 292' is thereby filled with the immersion liquid 34, as shown in FIG. 18.

Figure 19:
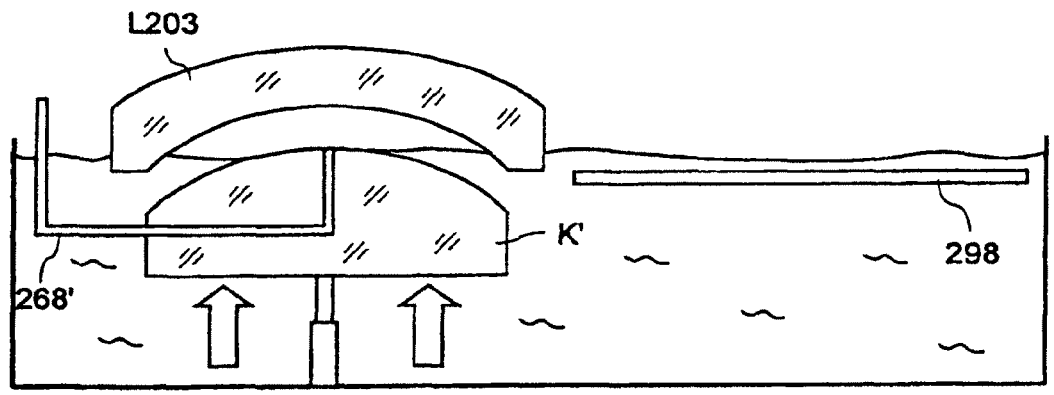
FIGS. 19 to 21 show a variant of the exemplary embodiment shown in FIG. 16, in various states during the filling of an immersion cavity.
Figure 20:
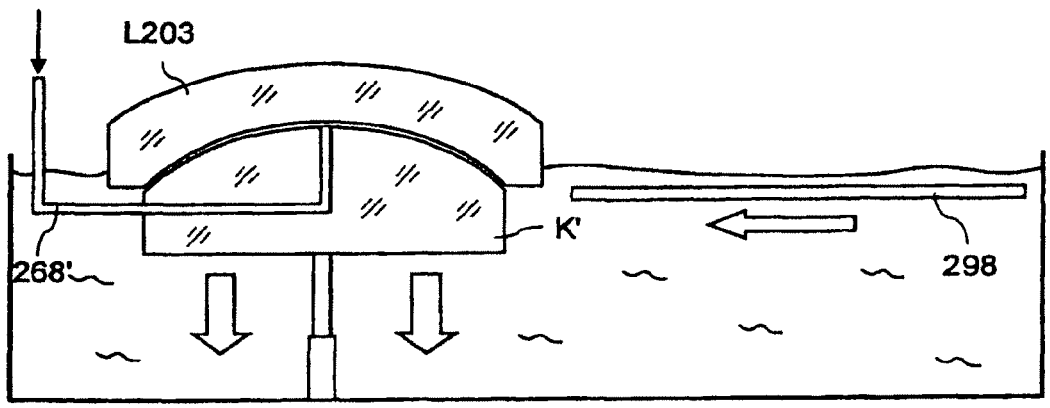
Figure 21:
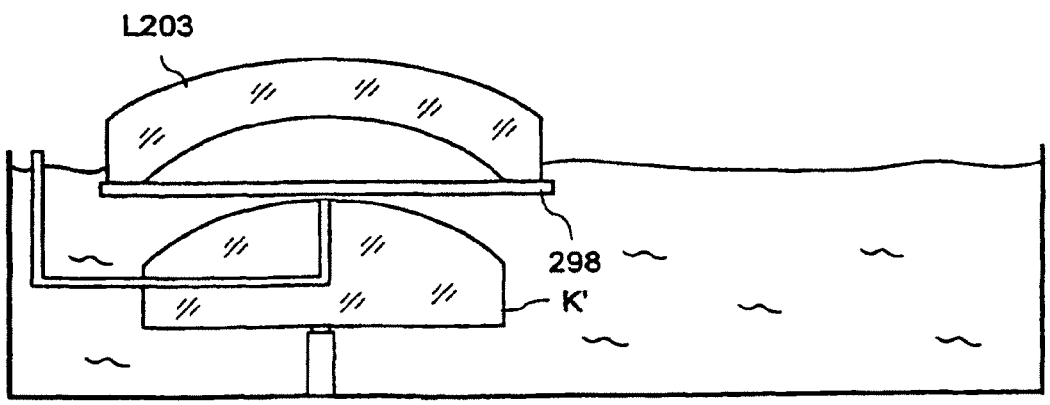

FIGS. 19 to 21 show very highly schematised sectional representations of a variant of the exemplary embodiment shown in FIG. 16, in which the immersion liquid 34 is supplied not via channels in the lens mount 252 but via a channel 268' contained in the displacement body K'. The displacement body K' is initially in a lower travelling position, where the displacement body can be aligned relative to the lens L203. This state is shown in FIG. 19.

The displacement body is now brought into an upper travelling position, as shown in FIG. 20. Immersion liquid, which is fed by positive pressure via the channel 268' into the intermediate space between the lens L203 and the displacement body K', therefore displaces residual air still remaining from the apex of the surface S.

Unlike in the exemplary embodiment represented in FIG. 16, the intermediate space 242 can be closed by a closure plate 298 after filling. To this end, the closure plate 298 is moved under the lens L203 from the side, after the displacement body K' has been transferred back into the lower travelling position after filling. Closing the cavity 242 with a closure plate 298 makes it possible for the surrounding liquid to be removed fully, and optionally for transport of the immersion objective 220 to be carried out.

For a further exemplary embodiment, FIGS. 22 to 25 show the various method steps relating to the way in which a cavity 342 between two lenses L303, L304 can be filled with a liquid 334 with the aid of a deformable membrane 292, without an air bubble being formed below a concave surface S of the lens L303.

To this end, the membrane 292 is fastened on an intermediate ring 354 and thereby divides the cavity 342 into an upper cavity 342a and a lower cavity 342b.

Via a first channel 368 in a mount 366 of the lower lens L304, liquid 334 is now initially fed into the lower cavity 342b until it is completely filled. The membrane 392 is permeable for air, so that air displaced from the lower cavity 342b by the filling can pass through the membrane 392 and emerge from the upper cavity 342a via a second channel 372.

Figure 22:
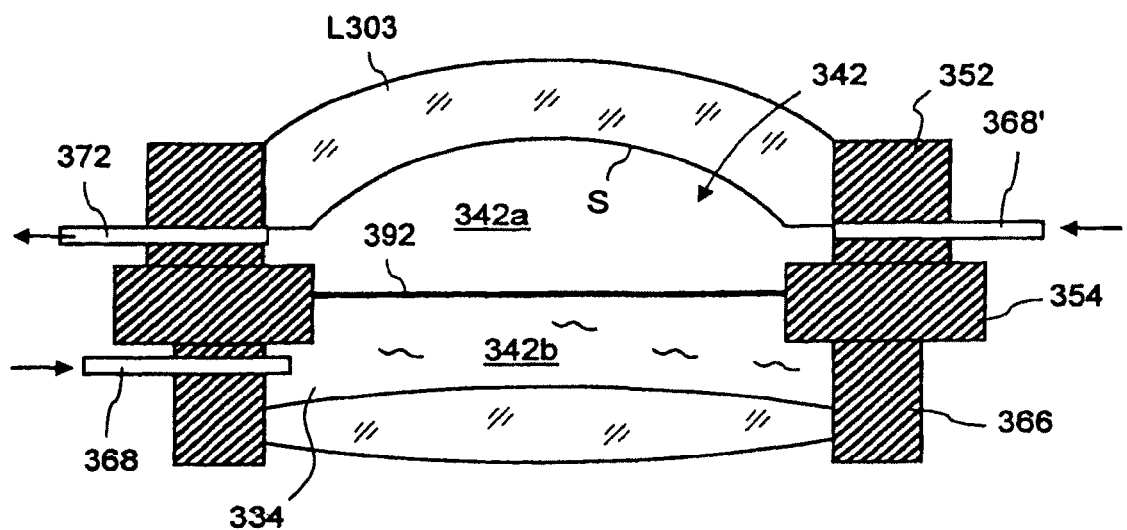
FIGS. 22 to 25 show a cavity bounded by lenses according to a fifth exemplary embodiment, in four different states during the filling with a liquid.
Figure 23:
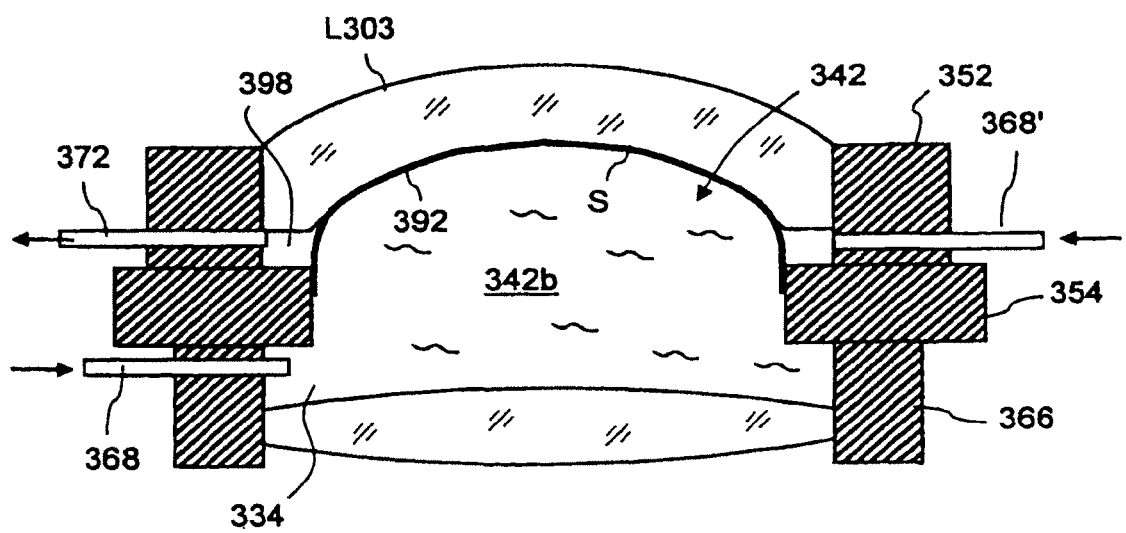
Figure 24:
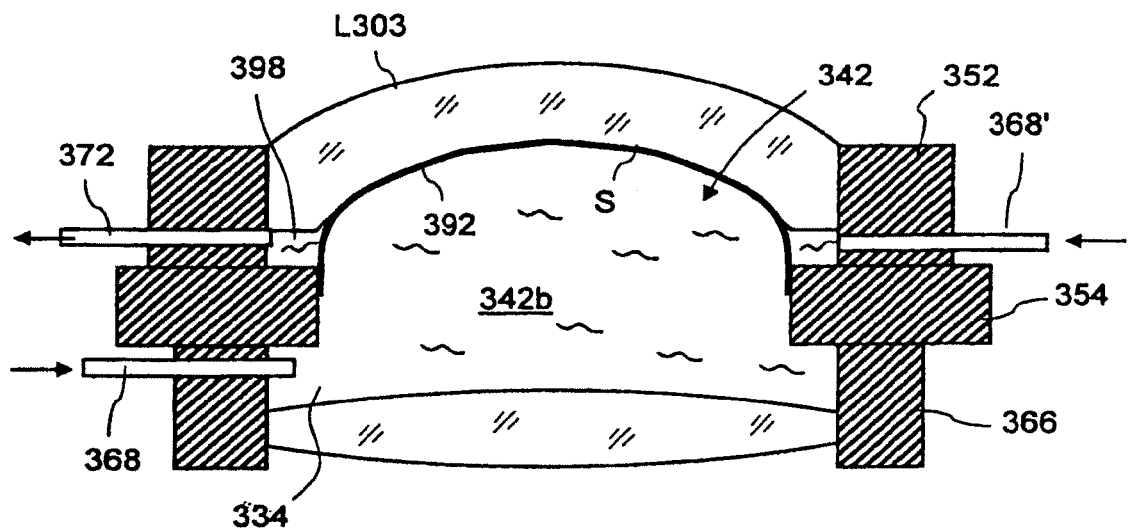
Figure 25:
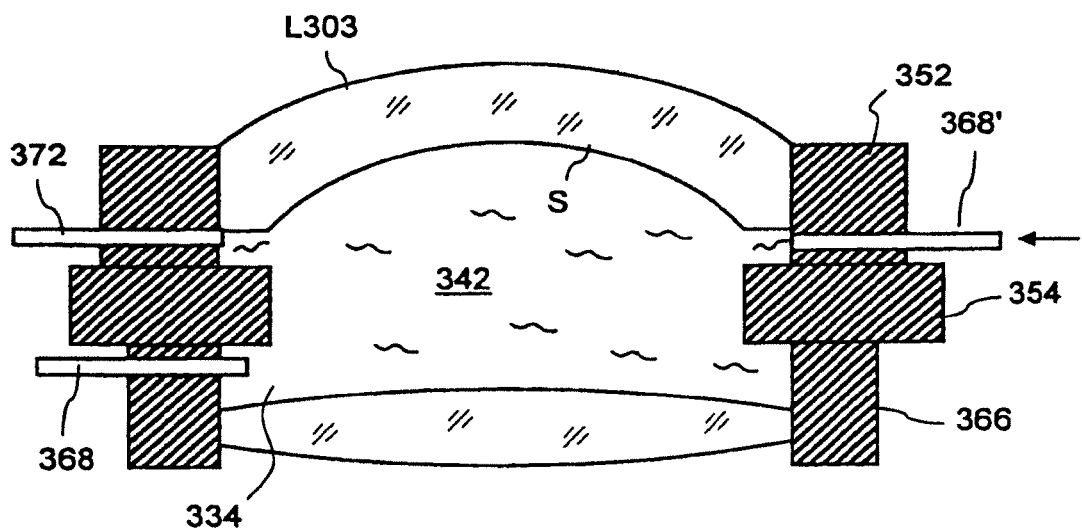

When the lower cavity 342b has been filled with the liquid 334, as shown in FIG. 22, further liquid 334 is introduced under pressure via the first channel 368. Owing to the positive pressure in the lower cavity 342b, the membrane 392 deforms and therefore displaces the air in the upper cavity 342a, which escapes via the second channel 372. This process is continued until the membrane 392 touches the concave surface S of the lens L303, as represented in FIG. 23.

Further liquid 334 is introduced in a subsequent step via a third channel 368', which is contained in a lens mount 352 of the lens L303, into an annular space 398 which remains between the now concavely curved membrane 392, the lens L303, the intermediate ring 354 and the lens mount 352. When the annular channel 398 is being filled, the liquid 334 displaces the air from the annular channel 398 which can emerge via the second channel 372 (see FIG. 24). A liquid which chemically attacks the membrane 392 is introduced via the third channel 368' as soon as liquid enters the second channel 372, so that the membrane dissolves in the liquid and can be flushed out with it via the second channel 372 from the now no longer divided cavity 342. The liquid used to break down the membrane 392 may then be replaced by another liquid, which is intended to remain between the two lenses L303 and L304 during operation of the projection exposure apparatus (cf. FIG. 25).

3. Alignable Channel

Figure 26:
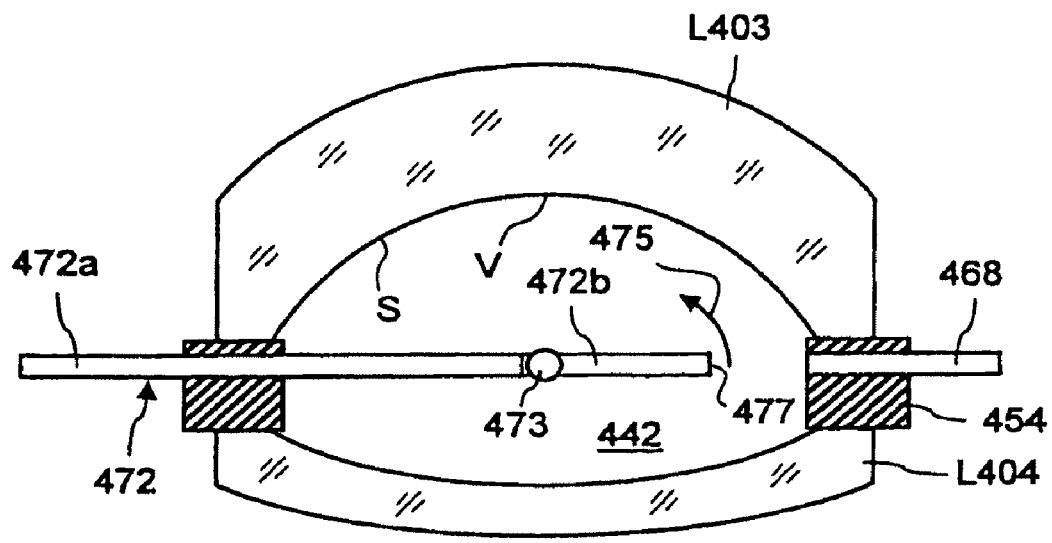
FIGS. 26 and 27 show a cavity bounded by lenses according to a sixth exemplary embodiment with an alignable vent channel, in two different states during the filling with a liquid.
Figure 27:
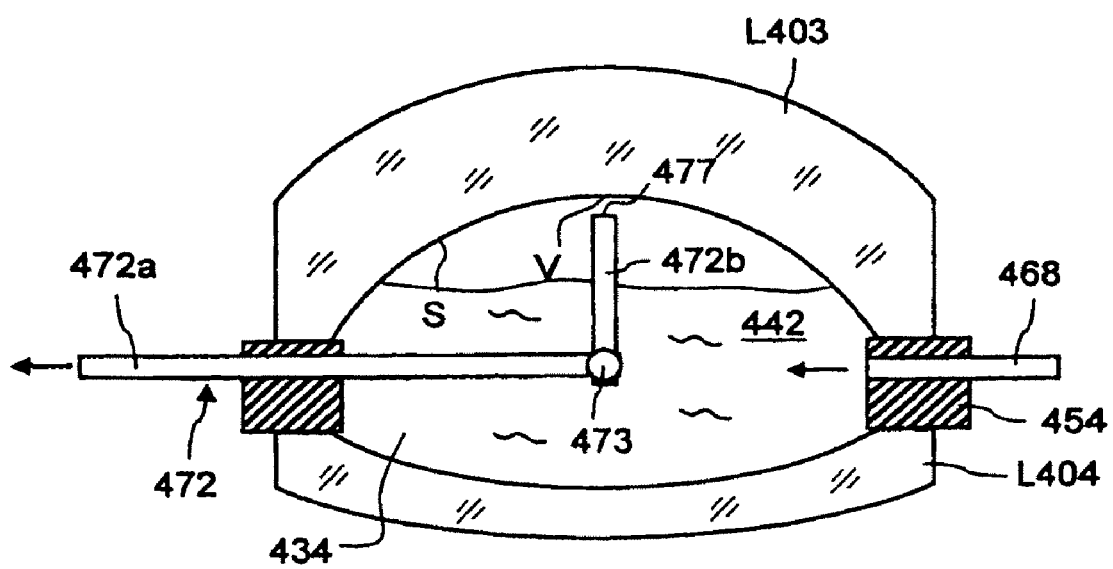
Figure 28:
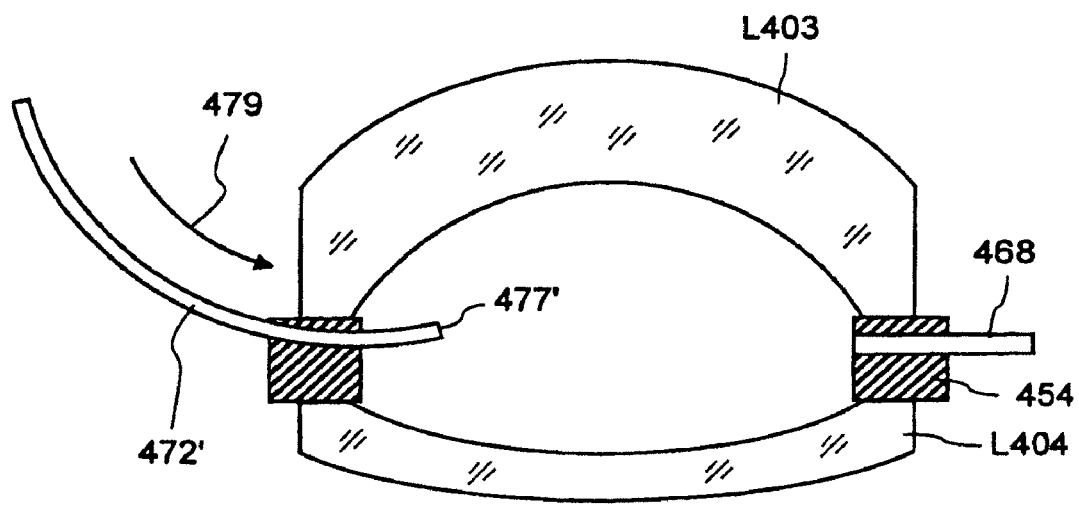
FIGS. 28 and 29 show a cavity bounded by lenses according to a seventh exemplary embodiment with a different vent channel, in two different states during the filling with a liquid.
Figure 29:
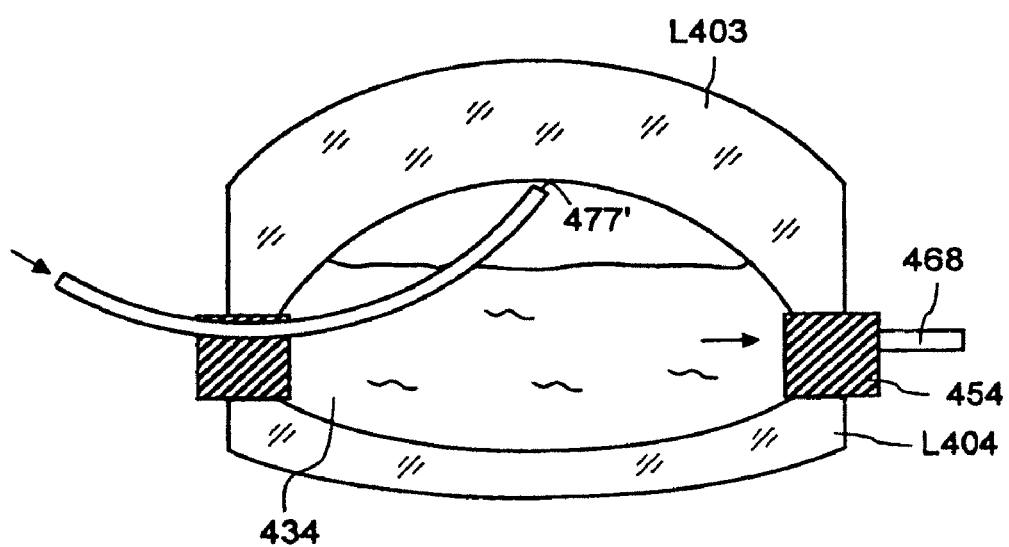

FIGS. 26 and 27 show an exemplary embodiment according the third aspect of the invention, in which the opening of a channel is brought immediately below the apex of the concavely curved surface when a cavity is being filled with a liquid.

Together with a second lens L404 and an intermediate ring 454, a first lens L403 which has a concavely curved surface S encloses a cavity 442 which is intended to be filled with a liquid 434. The mount ring 454 contains a first channel 468 and a second channel 472, both of which open into the cavity 442. The second channel 472 is divided into two sections 472a, 472b, which are connected to each other via an articulation 473. The second section 472b can be aligned via an actuation mechanism (not represented in detail in FIG. 26), as indicated by an arrow 475 in FIG. 26. In the aligned state, as can be seen in FIG. 27, the opening 477 of the second section 472b lies immediately below the apex V of the surface S.

If a liquid 434 is now introduced into the cavity 442 via the first channel 468, then it will displace the air present below the surface S. This, however, can escape out via the opening 477 of the aligned section 472b, which lies below the apex V. As soon as the cavity 442 has been completely filled with the liquid 434, the aligned section 472b is returned to its horizontal position with the aid of the actuation mechanism, as shown in FIG. 26. The entire second channel 472 can now be extracted from a bore in the intermediate ring 454 until the tiltable section 472b no longer lies in the beam path of the light. During operation of the projection exposure apparatus, the second channel 472 may be connected to a treatment unit so that the liquid 434 can be progressively circulated while being cleaned and thermally regulated.

In a representation corresponding to FIGS. 26 and 27, FIGS. 28 and 29 show a variant in which the opening of a channel used for venting is not positioned by aligning a section on an articulation. Such a channel, denoted by 472' in the FIG., is instead curved and held in a likewise curved guide in the intermediate ring 454. If the channel 472' is now inserted into the cavity 442 in the direction of the arrow 479, then an opening 477' of the channel 472' can be brought immediately below the apex V of the lens L403. In other regards, the exemplary embodiment shown in FIGS. 28 and 29 corresponds in function to the exemplary embodiment shown in FIGS. 26 and 27.

In a variant of the exemplary embodiments shown in FIGS. 26 to 29, the channel may also contain a material which has a shape memory. This term means materials which modify their shape in a defined way when the temperature changes. In particular, it is in this case feasible to introduce the channel straight into the cavity and then bend the channel by changing the temperature, so that its opening comes immediately below the apex of the concavely curved lens.

4. Channel in Lens

Figure 30:
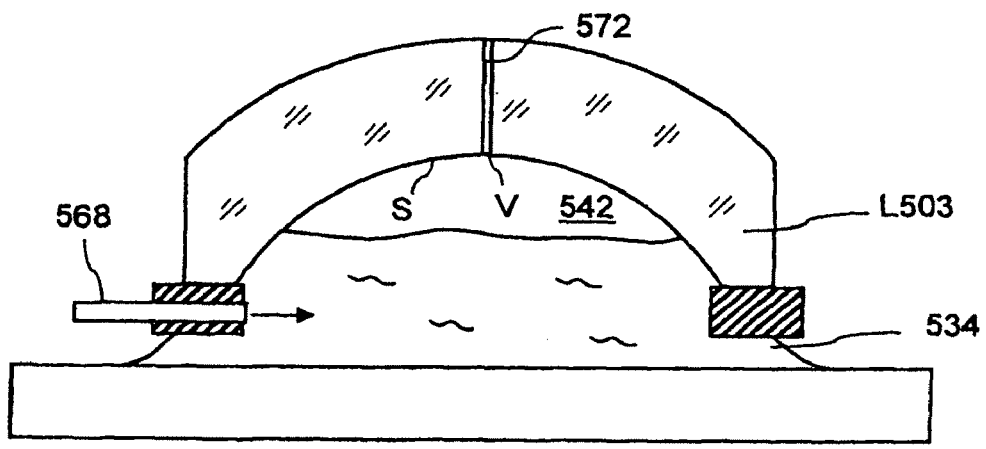
FIGS. 30 to 32 show three different variants of a concavely curved lens with a vent channel.
Figure 31:
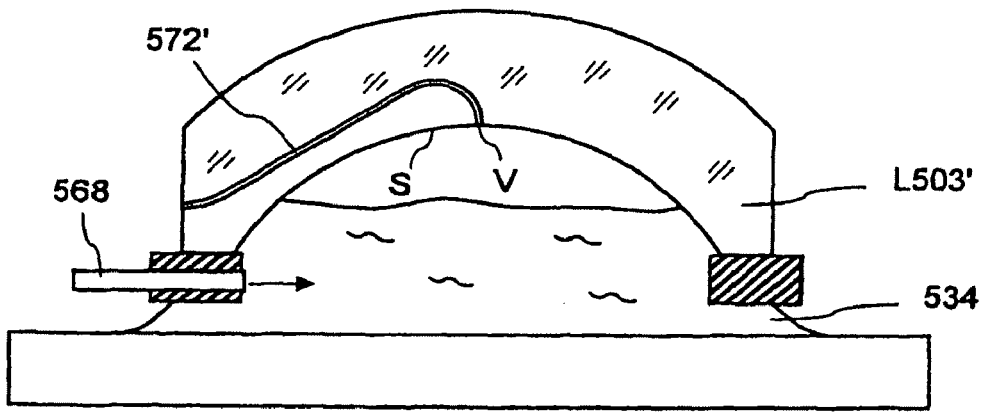
Figure 32:
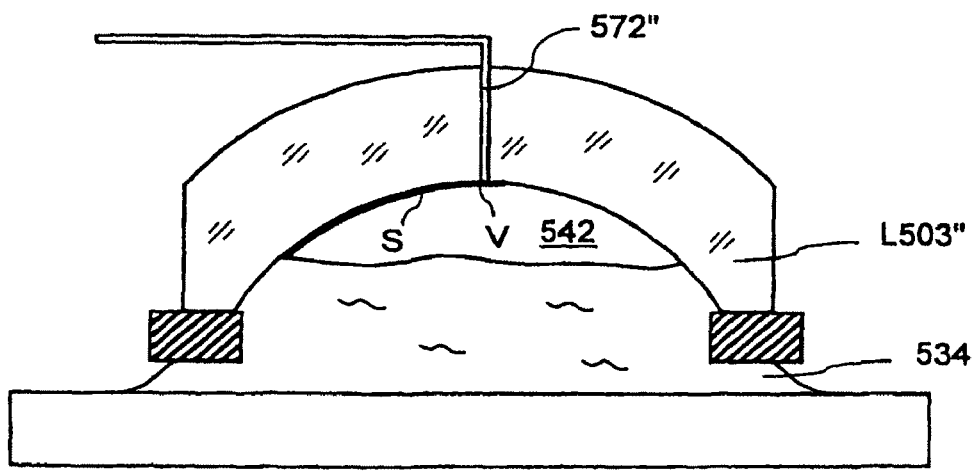

FIGS. 30 to 32 show further exemplary embodiments according to a fourth aspect of the invention, in which a channel used for venting is provided in the lens which contains the surface S curved concavely upwards.

In the exemplary embodiment shown in FIG. 30, a vent channel 572 extends along the symmetry axis of a lens L503. If immersion liquid 534 is introduced from below into the cavity 542 underneath the surface S via a channel 568, then the air present above the liquid level can escape via the vent channel 572 in the lens L503. This configuration is feasible, in particular, when the specifics of the beam path mean that no light rays, or at most very few light rays, pass through the lens L503 in the region of the vent channel 572.

In the exemplary embodiment shown in FIG. 31, although the vent channel denoted here by 572' opens immediately at the apex V of the concavely curved surface S, the vent channel 572' is nevertheless designed so that it emerges at its opposite end from the circumference of a lens L503'. Lateral release is expedient, for example, when air should not enter the region above the lens L503.

FIG. 32 shows a variant in which, similarly as in the lens L503 shown in FIG. 30, a vent channel denoted by 572" extends along the symmetry axis of a lens L503". Here, however, the channel 572" is used not only for venting but also for filling the cavity 542, and is therefore continued as a tube outside the lens L503". The immersion liquid 534 introduced via the channel 572" emerges at the apex V of the surface S and initially wets it. The immersion liquid 534 is let in only slowly in this case, however, so that air present below the surface S can simultaneously emerge via the channel 572".

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An optical system comprising a module, which can be fitted in the optical system and removed from it as a unit, said module comprising:
   a) a cavity which is configured to be completely filled with a liquid and to, be hermetically sealed,
   b) a concavely curved optical surface, which bounds the cavity at the top during operation of the projection exposure apparatus
   wherein the optical system is an optical system of a microlithographic projection exposure apparatus.

2. An optical system according to claim 1, wherein the cavity is bounded at the bottom by a lens during operation of the projection exposure apparatus.

3. An optical system according to claim 2, wherein the lens is a plane-parallel plate.

4. An optical system according to claim 2 wherein the lens is the last optical element of the optical system from which light emerges during operation of the projection exposure apparatus.

5. An optical system according to claim 2, wherein the surface of the lens facing away from the cavity lies next to a further cavity, which is arranged below the cavity during operation of the projection exposure apparatus and which is configured to be completely filled with a liquid during operation of the projection exposure apparatus.

6. An optical system according to claim 5, wherein the further cavity is bounded at the bottom by the last optical element of the optical system from which light emerges during operation of the projection exposure apparatus.

7. An optical system according to claim 2, wherein
a) the concavely curved optical surface is part of a first lens, which is held in a first lens mount,
b) a second lens, which bounds the cavity at the bottom during operation of the projection exposure apparatus, is held in a second mount, and wherein,
c) the first mount and the second mount are hermetically connected to each other.

8. An optical system according to claim 7, wherein an intermediate element is arranged between the first mount and the second mount.

9. An optical system according to claim 8, wherein the intermediate element is annular.

10. An optical system according to claim 7, wherein the supply channel and the vent channel are formed in the intermediate element.

11. An optical system according to claim 1, wherein the module contains a supply channel to introduce a liquid into the cavity.

12. An optical system according to claim 1, wherein the module-contains a vent channel to discharge air from the cavity.

13. An optical system according to claim 1, which is configured as a projection objective to image structures contained in a mask into an image plane.

14. An optical system according to claim 1, wherein
a) the optical system is an immersion objective of the projection exposure apparatus,
b) the concavely curved optical surface is the last optical surface of the immersion objective during operation of the projection exposure apparatus, and
wherein
c) the cavity is hermetically sealed by a releasably fastened closure element in the direction of an image plane of the immersion objective.

15. An optical system according to claim 14, wherein the liquid is an immersion liquid.

16. An optical system according to claim 14, wherein the closure element is at least partially transparent.

17. An optical system according to claim 14, wherein the closure element comprises a plane-parallel plate.

18. An optical system according to claim 14, wherein a connection of the closure element to a connecting part for the module is electrically, magnetically or hydromechanically releasable.

19. An optical system according to claim 14, wherein the closure element is configured to be fastened to the connecting part by a reduced pressure that can be set up in the cavity.

20. An optical system according to claim 14, wherein the cavity is connectable to a liquid reservoir via a closable line.

21. An immersion objective, comprising:
a) a lens which has a concavely curved surface on the image side and is the last optical element on the image side,
b) a lens holder to hold the lens,
c) a closure element, which is releasably connectable to the lens holder directly or via an intermediate element, so as to create a sealable cavity to hold a liquid between the lens and the closure element,
wherein the lens holder, together with the closure element connected to it, form a module which is configured to be fitted in the immersion objective and to be removed therefrom as a unit, and the immersion objective is an immersion objective of a microlithographic projection exposure apparatus.

22. An immersion objective according to claim 21, wherein a connection of the closure element to a connecting part for the module is electrically, magnetically or hydromechanically releasable.

23. An optical system, comprising:
a) a cavity which is configured to be completely filled with a liquid and to be hermetically sealed,
b) a concavely curved optical surface, which bounds the cavity at the top during operation of the projection exposure apparatus, and
c) a displacement element which is arranged in the cavity and is movable into a displacement position where the displacement element bears substantially seamlessly on the concavely curved optical surface,
wherein the optical system is an optical system of a microlithographic projection exposure apparatus.

24. An optical system according to claim 23, wherein a gap having a width of less than 0.5 mm remains between the concavely curved optical surface and the displacement element when it is in the displacement position.

25. An optical system according to claim 24, wherein the width of the gap is less than 0.1 mm.

26. An optical system according to claim 23, wherein the displacement element has a curvature which is greater in magnitude than that of the concavely curved surface.

27. An optical system according to claim 23, wherein the displacement element is a deformable membrane.

28. An optical system according to claim 27, wherein the membrane divides the cavity into a first subspace, which is next to the concavely curved optical surface, and a second subspace which is not next to the concavely curved optical surface, and wherein the optical system is configured to set up a positive pressure relative to the first subspace in the second subspace.

29. An optical system according to claim 27, wherein the membrane is at least partially permeable for gases.

30. An optical system according to claim 27, wherein the membrane is partially permeable for the liquid.

31. An optical system according to claim 23, wherein the displacement element is a solid body having a surface which is shaped as the negative of the concavely curved optical surface.

32. An optical system according to claim 31, wherein the displacement element is configured to move out of a light path of the optical system by lateral movement.

33. An optical system according to claim 23, wherein the displacement element is soluble in a liquid.

* * * * *

UNITED STATES PATENT AND TRADEMARK OFFICE
CERTIFICATE OF CORRECTION

PATENT NO.        : 8,212,991 B2                                  Page 1 of 1
APPLICATION NO.   : 12/628294
DATED             : July 3, 2012
INVENTOR(S)       : Aurelian Dodoc et al.

It is certified that error appears in the above-identified patent and that said Letters Patent is hereby corrected as shown below:

Column 6,
Line 29, delete "the 'cavity" and insert --the cavity--

Column 16,
Line 57, delete "to," and insert --to--

Signed and Sealed this
Twenty-fifth Day of September, 2012

David J. Kappos
*Director of the United States Patent and Trademark Office*